United States Patent
Ochi et al.

(10) Patent No.: US 8,203,342 B2
(45) Date of Patent: Jun. 19, 2012

(54) NUCLEAR MAGNETIC RESONANCE IMAGING SYSTEM AND COIL UNIT

(75) Inventors: Hisaaki Ochi, Kodaira (JP); Yoshihisa Soutome, Tokyo (JP); Yoshitaka Bito, Kokubunji (JP); Takeshi Yatsuo, Kashiwa (JP); Hiroyuki Takeuchi, Kashiwa (JP)

(73) Assignees: Hitachi, Ltd., Tokyo (JP); Hitachi Medical Corporation, Tokyo (JP)

( * ) Notice: Subject to any disclaimer, the term of this patent is extended or adjusted under 35 U.S.C. 154(b) by 372 days.

(21) Appl. No.: 12/519,832

(22) PCT Filed: Dec. 13, 2007

(86) PCT No.: PCT/JP2007/074056
§ 371 (c)(1),
(2), (4) Date: Dec. 15, 2009

(87) PCT Pub. No.: WO2008/075614
PCT Pub. Date: Jun. 26, 2008

(65) Prior Publication Data
US 2011/0175616 A1    Jul. 21, 2011

(30) Foreign Application Priority Data
Dec. 21, 2006  (JP) .................................. 2006-343704

(51) Int. Cl.
*G01V 3/00* (2006.01)
(52) U.S. Cl. ....................................... 324/318; 324/322
(58) Field of Classification Search .......... 324/300–322; 600/407–445
See application file for complete search history.

(56) References Cited

U.S. PATENT DOCUMENTS

| 4,820,985 | A |   | 4/1989  | Eash |
| 4,916,418 | A |   | 4/1990  | Rath |
| 4,926,125 | A | * | 5/1990  | Roemer ........................ 324/318 |
| 5,017,872 | A | * | 5/1991  | Foo et al. ...................... 324/322 |
| 5,467,017 | A |   | 11/1995 | Duerr et al. |

(Continued)

FOREIGN PATENT DOCUMENTS

JP    63-073605    4/1988
(Continued)

OTHER PUBLICATIONS

Findeklee et al., "Efficient Design of a Novel double Tuned Quadrature Headcoil for Simultaneous 1H and 31P MRI/MRS at 7T", Proc. Intl. Soc. Mag. Reson. Med. 13, May 2005, p. 891.

(Continued)

*Primary Examiner* — Brij Shrivastav
(74) *Attorney, Agent, or Firm* — Antonelli, Terry, Stout & Kraus, LLP.

(57) ABSTRACT

A coil unit comprises a gradient coil which is disposed along a static magnetic field generating source, and a radio frequency coil which is disposed along the gradient coil in a test region at a position closer to the center of the test region compared with the gradient coil, and a conductor part which is disposed between the gradient coil and the radio frequency coil, and covers periphery of the radio frequency coil. The radio frequency coil comprises a first loop coil and a second loop coil locating in planes substantially perpendicular to direction of the static magnetic field, a plurality of linear conductors connecting the first loop coil and the second loop coil and substantially parallel to the direction of the static magnetic field, and a plurality of first capacitors disposed in the first loop coil and the second loop coil.

15 Claims, 17 Drawing Sheets

U.S. PATENT DOCUMENTS

| | | | |
|---|---|---|---|
| 5,557,247 A | 9/1996 | Vaughn, Jr. | |
| 6,215,309 B1 * | 4/2001 | Rzedzian et al. | 324/322 |
| 6,710,598 B2 | 3/2004 | Leussler et al. | |
| 7,271,592 B1 * | 9/2007 | Gerald et al. | 324/321 |
| 7,639,012 B2 * | 12/2009 | Habara et al. | 324/318 |
| 7,800,368 B2 * | 9/2010 | Vaughan et al. | 324/318 |
| 2003/0062846 A1 | 4/2003 | Shen | |
| 2004/0245989 A1 | 12/2004 | Holle | |
| 2005/0083057 A1 | 4/2005 | Schulz et al. | |
| 2010/0253347 A1 * | 10/2010 | Habara et al. | 324/318 |

FOREIGN PATENT DOCUMENTS

| | | |
|---|---|---|
| JP | 02-013872 | 1/1990 |
| JP | 05-103767 | 4/1993 |
| JP | 07-000372 | 1/1995 |
| JP | 2004-513718 | 5/2004 |
| JP | 2005-506167 | 3/2005 |
| JP | 2005-515051 | 5/2005 |
| WO | WO 03/062846 A2 | 7/2003 |

OTHER PUBLICATIONS

Q. Chen et al., "Guard-Ring Coupled Birdcage Resonator for MRI", IEICE Technical Report, EMCJ95-80, pp. 31-38 (1996).

* cited by examiner (a)

(b)

(a)

(b)

(a)

(b)

(a)

(b)

(a)

(b)

NUCLEAR MAGNETIC RESONANCE IMAGING SYSTEM AND COIL UNIT

TECHNICAL FIELD

The present invention relates to a nuclear magnetic resonance imaging system (henceforth referred to as "MRI system") and a coil unit used for it.

BACKGROUND ART

An MRI system irradiates electromagnetic waves on a subject stayed in a uniform static magnetic field generated by a magnet to excite nuclear spins in the subject, then receives nuclear magnetic resonance signals which are electromagnetic waves generated by the nuclear spins, and forms an image of the subject. The irradiation of electromagnetic waves and reception of nuclear magnetic resonance signals are attained with an RF coil which transmits or receives electromagnetic waves of radio frequency (RF), and transmitting coils, receiving coils and coils serving as the both having various shapes suitable for MRI systems have been developed. For RF coils which performs irradiation of electromagnetic waves and detection of magnetic resonance signals, improvement in irradiation efficiency and irradiation homogeneity as well as improvement in receiving sensitivity and homogeneity of sensitivity distribution are desired.

When nuclear spins induced in a subject are excited, a coil showing a homogenous sensitivity distribution is needed for accurate imaging of an imaging region. Birdcage type RF coils and multiple patch resonators are known as coils having a homogeneous sensitivity region (for example, Patent documents 1 and 2).

A so-called birdcage type RF coil such as one described in Patent document 1 is usually formed on an RF base of cylindrical shape, and comprises linear conductors (rungs) extending along the axial direction of the cylinder (z-axis direction), and circular conductors (rings) locating at the ends of the foregoing conductors. It is referred to by using the number of rungs, for example, "16-rung birdcage coil". In the case of high pass RF coil, capacitors are disposed in the aforementioned rings. It is tuned by attaching electrical components such as capacitors and diodes to constitute an RF transmitting coil. An example of high pass type birdcage type RF coil is shown in FIG. 16. In this RF coil, two loop conductors 28 and 29 are oppositely disposed so that they should have a common center axis parallel to the z-axis among the coordinate axes, and they are connected with a plurality of linear conductors 30 (there are 12 conductors in FIG. 16) parallel to the z-axis among the coordinate axes. A plurality of the linear conductors 30 is disposed at equal intervals. The direction of the z-axis among the coordinate axes and the direction 100 of the static magnetic field generated by a magnet of MRI system are the same. A plurality of capacitors Cr are disposed between connecting points of the linear conductors 30 and the loop conductors 28 and 29, and an electric power supply point 35 is disposed at one of the capacitors.

Birdcage type RF coils have an advantage that tuning thereof is easy, and therefore they are widely used in horizontal magnetic field type MRI systems. However, they have a problem that, when the frequency to be used becomes higher with use of higher intensity of magnetic field in MRI systems, the Q values of coils are decreased. In particular, for use in a region where resonance frequency of hydrogen nucleus exceeds 160 MHz as in MRI systems having a static magnetic field intensity of 4 teslas or higher, size of a large coil such as RF transmitting coils exceeds the wavelength, thus decrease of the Q value becomes marked, and it becomes difficult to use such a coil. For this reason, use of birdcage type RF coil as an RF coil for transmission in MRI systems for imaging of human body is limited to those in MRI systems having a static magnetic field intensity up to about 3 teslas.

QD (Quadrature Detection) method is known as a method for improving irradiation efficiency and receiving sensitivity of an RF coil. The QD method is a method of detecting magnetic resonance signals by using two RF coils disposed so that axes thereof should be orthogonal to each other. If magnetic resonance signals are detected by the QD method, signals are detected by the RF coils with phases different by 90 degrees. Synthesis of these detected signals theoretically improves SN ratio $\sqrt{2}$ times compared with the case where the signals are received with one RF coil. Moreover, since circularly polarized waves are irradiated for irradiation of a high frequency magnetic field, electric power is halved, and thus heat generation due to high frequency heating in human body can be reduced. Furthermore, the QD method is also effective in view of homogeneity of images to be obtained, and it can improve sensitivity homogeneity for the x-y plane. It is easy to carry out the QD method with a birdcage type RF coil, because of the structural symmetry thereof. By disposing two electric power supply ports for transmitting and receiving signals at positions orthogonal to each other in the direction from the center, it becomes possible to perform transmission and reception by the QD method with one coil. An example of the birdcage type RF coil of FIG. 16 which is made to enable the QD method is shown in FIG. 17. In this coil, electric power supply ports 35-1 and 35-2 are disposed at positions orthogonal to each other in the direction from the center.

Birdcage type RF coils also have an advantage that they generally show high homogeneity of sensitivity distribution along the x-axis direction and y-axis direction.

On the other hand, homogeneity of sensitivity distribution along the z-axis direction is generally proportional to the length of the rungs. In order to obtain correct image of an imaging region, it is desired that non-homogeneity of sensitivity (non-homogeneity of RF power) in the imaging region should be 30% or less at the time of excitation. In order to make the non-homogeneity of sensitivity in an imaging region 30% or less at the time of excitation by using a birdcage type RF coil, the length of rungs is required to be about 1.5 times longer than the size of the imaging region along the z-axis direction. For example, when the imaging region has a length of 35 cm along the z-axis direction, the rung length is required to be 53 cm.

In the multiple patch resonator described in Patent document 2, a plurality of linear conductors (rungs) extending along the z-axis direction are disposed inside a cylindrical RF shield at equal intervals, and the rungs and the RF shield are connected via capacitors. The ring parts used in birdcage type RF coils do not exist in multiple patch resonators. Since multiple patch resonators can maintain the Q values of coils to be high even if the frequency to be used becomes higher in MRI systems having a higher magnetic field intensity, they have an advantage that they can be used even in MRI systems utilizing a static magnetic field intensity exceeding 3 teslas. However, tuning of multiple patch resonators is more complicated compared with that of birdcage type RF coils. This is because electromagnetic independency of the multiple rungs becomes higher, because the ring parts do not exist.

When the QD method is carried out with a multiple patch resonator having a coil of a small size such as a coil for imaging head, transmission and reception of circularly polarized waves are possible only by using two electric power supply ports disposed at positions whose directions from the center are orthogonal (orthogonal positions). However, in order to carry out transmission and reception of circularly polarized waves with a coil having a large size such as a coil for imaging whole body (transmitting coil), it is common to transmit and receive pulses from four electric power supply ports locating at positions each of which shifts by 90 degrees from the adjacent position with phases different by 90 degrees from that of pulse transmitted/received in the adjacent electric power supply port. This is because, because the ring parts do not exist also in this case, electromagnetic independency of the multiple rungs is high, and when electric power is supplied at the rung of the position of 0 degree, current of the rung locating at the position of 180 degrees (locating at the opposite position) is unlikely to be influenced. Increase in number of the electric power supply ports from two to four complicates adjustment at the time of use, and also increases the cost.

Patent document 1: U.S. Pat. No. 4,916,418
Patent document 2: U.S. Pat. No. 5,557,247

DISCLOSURE OF THE INVENTION

Object to be Achieved by the Invention

An RF shield can be disposed at a position of a certain distance from conductors of RF coil. The RF shield functions in two ways, a) to reduce noises emitted from the gradient coil, and b) to shield electromagnetic coupling between the gradient coil conductors and the RF coil, and it is constituted with non-magnetic metal foils and meshes appropriately laminated, and disposed by adhering it on a resin support or a surface of gradient coil.

Since a human body is inserted into the inside of the birdcage type transmitting RF coil, it generally has a large ring diameter. Therefore, the distance between the RF shield and the RF coil generally becomes small. The distance between the RF shield and the RF coil is typically required to be 10 to 40 mm. If they are disposed closer, there arise problems, a) radio frequency eddy currents increase to compensate the magnetic field, and therefore magnetic field generating efficiency is degraded, and b) magnetic field distribution around the RF coil rapidly changes to increase non-homogeneity of RF power in an imaging region. Therefore, it is generally difficult to make this interval narrower than 10 mm.

As a modification of birdcage type RF coil, a birdcage type RF coil having a shield in which a guard ring as a shield is disposed inside the ring portion is known (Non-patent document 1). It is known that the birdcage type RF coil with a guard ring is effective for suppressing an electric field component by a function of the guard ring.

Outside the RF shield, a gradient coil can be disposed. In the case of an active shield gradient coil comprising a main coil and a shield coil, coils which generate magnetic fields of reverse directions are disposed to reduce eddy currents generated in a container or metal member surrounding the static magnetic field generating source (magnet). The static magnetic field generating source (magnet) can be disposed at the outermost position. As the static magnetic field generating source, super-conductive magnets and permanent magnets are widely used nowadays. Regardless of the type of the static magnetic field generating source and not depending on the shape, cylindrical shape type or oppositely disposed type, disposition of the static magnetic field generating source at a position closer to the region of subject improves magnetic field generating efficiency and enables construction of more inexpensive static magnetic field generating source.

If the aforementioned parts are piled up, a thickness of about 150 mm is typically needed as the total thickness of from the RF coil to the gradient coil. If this thickness can be reduced, and the cover has the same internal diameter, internal diameter of super-conductive magnet can be made smaller, and therefore super-conductive magnet can be constituted at a lower cost. Alternatively, if the super-conductive magnet has the same internal diameter, space for the subject can be made larger. Further, even with the same thickness, the space between the main coil and the shield coil in the gradient coil, or the space between the RF coil and the RF shield can be increased, thereby magnetic field generating efficiency of the gradient coil and the RF coil can be improved, and cost for amplification means such as amplifier connected to each can be reduced. As a means for satisfying such a need, there is known a configuration of a gradient coil having a concave in which RF coil is disposed (for example, Patent document 3).

Patent document 3 discloses a configuration that a part of gradient coil protrudes toward the inside the coil, where RF coil does not exist, for reducing energy needed for the gradient coil. In this configuration, if the thickness is the same, the space between the main coil and the shield coil is increased at the part where the gradient coil protrudes, therefore it becomes possible to increase magnetic field generating efficiency, and gradient magnetic field intensity or rate of rise of the gradient magnetic field can be increased. If the axial length of the RF coil (rung length) is shortened to shorten the length of the concave in the axial direction, performance of the gradient coil can be further improved.

However, if the axial length of the RF coil (rung length) is shortened, homogeneity of sensitivity distribution along the z-axis direction will be degraded. As described above, in order to make non-homogeneity of sensitivity 30% or less in an imaging region at the time of excitation by using a birdcage type RF coil, the length of rung is required to be 1.5 times longer than the length of the imaging region along the z-axis direction. Therefore, for example, if the axial length of the RF coil (rung length) is shortened to 40 cm, there arises a problem that the length along the z-axis direction of the imaging region in which non-homogeneity of sensitivity is 30% or less is only about 27 cm.

In view of the aforementioned problems of the conventional technique, an object of the present invention is to provide a birdcage type RF coil which can provide a large region having homogeneous sensitivity for the axial direction even with a shortened rung length.

Non-patent document 1: Q. Chen et al., "Guard-Ring Coupled Birdcage Resonator for MRI", IEICE Technical Report, EMCJ95-80, pp. 31-38 (1996)

Patent document 3: International Patent Publication WO2003/062846

Means for Achieving the Object

The MRI system of the present invention, with which the aforementioned object is achieved, comprises, as an embodiment, a static magnetic field generating source of a cylindrical shape which generates a static magnetic field; a gradient coil which is disposed along the static magnetic field generating source in a test region surrounded by the static magnetic field generating source; a radio frequency coil which is disposed along the gradient coil in the test region at a position closer to the center of the test region compared with the gradient coil, and comprises a first loop coil and a second loop coil locating in planes substantially perpendicular to direction of the static magnetic field, a plurality of linear conductors connecting the first loop coil and the second loop coil and substantially parallel to the direction of the static magnetic field, and a plurality of first capacitors disposed in the first loop coil, the second loop coil and/or the linear conductors; a conductor part which is disposed between the gradient coil and the radio frequency coil, and covers periphery of the radio frequency coil; a first connecting part which electrically connects the radio frequency coil and the conductor part via a second capacitor, and comprises an electric power supply circuit disposed in parallel to the second capacitor; and a second connecting part which connects the radio frequency coil and the conductor part via a third capacitor.

Another embodiment of the MRI system of the present invention comprises a static magnetic field generating source of a cylindrical shape which generates a static magnetic field; a gradient coil which is disposed along the static magnetic field generating source in a test region surrounded by the static magnetic field generating source; a radio frequency coil which is disposed along the gradient coil in the test region at a position closer to the center of the test region compared with the gradient coil, and comprises a first loop coil and a second loop coil locating in planes substantially perpendicular to direction of the static magnetic field, a plurality of linear conductors connecting the first loop coil and the second loop coil and substantially parallel to the direction of the static magnetic field, and a plurality of first capacitors disposed in the first loop coil, the second loop coil and/or the linear conductors; and a conductor part which is disposed between the gradient coil and the radio frequency coil, wherein the conductor part covers periphery of the radio frequency coil, the gradient coil comprises a first part which surrounds periphery of the radio frequency coil, and a second part closer to the end of the gradient coil, and the first part has an internal diameter larger than that of the second part.

A further embodiment of the MRI system of the present invention comprises a static magnetic field generating source of a cylindrical shape, which generates a static magnetic field; a gradient coil which is disposed along the static magnetic field generating source in a test region surrounded by the static magnetic field generating source; a radio frequency coil which is disposed along the gradient coil in the test region at a position closer to the center of the test region compared with the gradient coil, and comprises a first loop coil and a second loop coil locating in planes substantially perpendicular to direction of the static magnetic field, a plurality of linear conductors connecting the first loop coil and the second loop coil and substantially parallel to the direction of the static magnetic field, and a plurality of first capacitors disposed in the first loop coil, the second loop coil and/or the linear conductors; and a conductor part which is disposed between the gradient coil and the radio frequency coil, wherein the conductor part covers periphery of the radio frequency coil, and the gradient coil has a shape in which internal diameter becomes smaller from the center to the end thereof along the direction of the static magnetic field generated by the static magnetic field generating source.

Effect of the Invention

According to the present invention, there can be realized a birdcage type RF coil which has a large region having homogeneous sensitivity for the axial direction even if the rung length of the RF coil is shortened. If such an RF coil is used as a transmitting RF coil, it becomes possible to dispose the transmitting RF coil in a concave inside a gradient coil having a small diameter, and as a result, an MRI system provided with a gradient coil showing improved magnetic field generating efficiency can be constituted.

BEST MODE FOR CARRYING OUT THE INVENTION

Hereafter, preferred embodiments of the RF coil and MRI system of the present invention will be explained in detail. However, the present invention is not limited by these explanations.

Overall configuration of a magnetic resonance imaging system to which the present invention is applied will be explained first. FIG. 1 shows outline of the MRI system, and in the drawing, the direction of the z-axis is the direction of the static magnetic field. The apparatus is disposed so that, for example, it should be substantially horizontal for the direction of the static magnetic field. FIG. 1 shows the MRI system provided with a magnet 2 for horizontal magnetic field type, and a subject 1 lying on a table 301 is inserted into an imaging space in a bore of the magnet 2, and imaged.

Outline of the whole configuration of an embodiment of the MRI system of the present invention will be explained with reference to FIG. 2. FIG. 2 is a block diagram showing the whole configuration of an embodiment of the MRI system of the present invention. This MRI system is for obtaining a tomographic image of a subject using the NMR phenomenon, and as shown in FIG. 2, the MRI system is provided with a static magnetic field generating system 2, a gradient magnetic field generating system 3, a transmitting system 5, a receiving system 6, a signal processing system 7, a sequencer 4, and a central processing unit (CPU) 8.

The static magnetic field generating system 2 is provided with a static magnetic field generating source of permanent magnet type, resistive conduction type or superconductive type disposed around the subject 1. In a space around the subject 1, a substantially homogeneous static magnetic field is generated along the direction perpendicular to the body axis direction in the case of a vertical magnetic field type apparatus, or along the body axis direction in the case of a horizontal magnetic field type apparatus. In the case of a horizontal static magnetic field apparatus, for example, a static magnetic field generating source of a cylindrical shape surrounding a test region including the subject can be used.

The gradient magnetic field generating system 3 comprises a gradient coil 9 including coils wound along three axial directions of X, Y and Z of the coordinate system (rest frame) of the MRI system, and a gradient magnetic field power supply 10 which drives each gradient coil, and drives the gradient magnetic field power supply 10 for each coil according to commands from the sequencer 4 to apply gradient magnetic fields Gx, Gy and Gz along the three axial directions of X, Y and Z. For example, at the time of imaging, a slice direction gradient magnetic field pulse (Gs) is applied along the direction perpendicular to the slice plane (imaging section) to establish a slice plane for the subject 1, and a phase encoding direction gradient magnetic field pulse (Gp) and a frequency encoding direction gradient magnetic field pulse (Gf) are applied along the two remaining directions orthogonal to the slice plane and orthogonal to each other to encode positional information for each direction in echo signals. In the case of a horizontal static magnetic field type apparatus, the gradient coil 9 is disposed along the static magnetic field generating source.

The sequencer 4 is a control means which repeatedly applies a high frequency magnetic field pulse (henceforth referred to as "RF pulse") and a gradient magnetic field pulse as a certain predetermined pulse sequence, and it is operated under the control of CPU 8, and sends various commands required for tomographic image data collection of the subject 1 to the transmitting system 5, the gradient magnetic field generating system 3, and the receiving system 6.

The transmitting system 5 irradiates an RF pulse on the subject 1 in order to induce nuclear magnetic resonance in nuclear spins of atoms constituting living tissues of the subject 1, and it comprises a high frequency oscillator 11, a modulator 12, a high frequency amplifier 13, and a radio frequency coil 14a for transmission (transmitting coil). A high frequency pulse outputted from the high frequency oscillator 11 is amplitude-modulated with the modulator 12 at a timing commanded by the sequencer 4, this amplitude-modulated high frequency pulse is amplified with the high frequency amplifier 13, and then supplied to the radio frequency coil 14a disposed adjacently to the subject 1, and thereby the RF pulse is irradiated on the subject 1.

The receiving system 6 detects echo signals (NMR signals) emitted due to the nuclear magnetic resonance of the nuclear spins of atoms constituting living tissues of the subject 1, and comprises a radio frequency coil 14b for receiving signals, a signal amplifier 15, a quadrature phase detector 16, and an A/D converter 17. NMR signals of the subject 1 as a response induced by electromagnetic waves irradiated from the radio frequency coil 14a for transmission are detected with the radio frequency coil 14b disposed adjacently to the subject 1, amplified by the signal amplifier 15, then divided into two signal series orthogonal to each other with the quadrature phase detector 16 according to a timing commanded by the sequencer 4, and the signals of each series are converted into digital signals with the A/D transducer 17, and sent to the signal processing system 7.

The signal processing system 7 performs various data processing operations, displays and stores results of the processing operations, comprises an external storage means such as an optical disc 19 or magnetic disc 18, a display 20 consisting of CRT or the like, and memories such as ROM 21 and RAM 22. When data are inputted from the receiving system 6 into CPU 8, CPU 8 executes operations such as signal processing and image reconstruction, and a tomographic image of the subject 1, as a result of the operations, is displayed on the display 20 and recorded in the external storage means such as the magnetic disc 18.

An operating part 25 is for inputting various kinds of information for controlling the MRI system and information for controlling the operations executed by the aforementioned signal processing system 7, and comprises a trackball or mouse 23, and a keyboard 24. This operating part 25 is disposed adjacently to the display 20, and an operator interactively controls various operations in the MRI system via the operating part 25 with looking at the display 20.

In FIG. 2, the radio frequency coil 14a of the transmission side and the gradient coil 9 are disposed in a space in which the subject 1 is inserted, and a static magnetic field is generated by the static magnetic field generating system 2, so as to face the subject 1 in the case of a vertical magnetic field type apparatus, or so as to surround the subject 1 in the case of a horizontal magnetic field type apparatus. The radio frequency coil 14b of the reception side is also disposed so as to face the subject 1 or surround the subject 1. The radio frequency coil is disposed in the test region at a position closer to the center compared with the gradient coil.

The basic coil configuration of birdcage type RF coil used as the radio frequency coil is the same as the configuration shown in FIG. 16. That is, in the RF coil, two loop conductors 28 and 29 are disposed so that they should face each other and have a common center axis parallel to the z-axis among the coordinate axes, and connected with a plurality of linear conductors 30 (12 conductors in FIG. 16) parallel to the z-axis among the coordinate axes. A plurality of the linear conductors 30 are disposed at equal intervals. Between connecting points of a plurality of the linear conductors 30 and the loop conductors 28 and 29, a plurality of ring capacitors Cr are disposed, and an electric power supply point 35 is disposed at one of a plurality of the ring capacitors Cr.

This RF coil is installed in an MRI system so that the direction of the z-axis among the coordinate axes should be the same as the direction 100 of the static magnetic field generated by the magnet 2 of the MRI system. In the case of a horizontal magnetic field type apparatus, the loop conductors locate in planes substantially perpendicular to the direction of the static magnetic field, and linear conductors are disposed in substantially parallel to the direction of the static magnetic field.

The nuclide for imaging in current MRI systems widely used in clinical sites is hydrogen nucleus (proton), which is the main constituent substance of subject. By imaging special distribution of proton density, or information about spatial distribution of relaxation time from excited state, physical configurations or functions of head, abdominal part, extremities and so forth of human body are two-dimensionally or three-dimensionally imaged.

Hereafter, embodiments of the coil unit used for the MRI system of the present invention will be explained.

FIRST EMBODIMENT

The coil unit of this embodiment is provided with, as shown in FIG. 3, a cylindrical gradient coil 51, an RF coil 52 disposed inside the gradient coil, and an RF shield 53 disposed between the gradient coil 51 and the RF coil 52. The RF coil 52 is a birdcage type RF coil having two ring parts (loop coils) and a plurality of rung parts connecting the loops, and the number of the rungs is, for example, twelve.

A part (first part) of the gradient coil 51 surrounding periphery of a rung part of the RF coil 52 has an internal diameter larger than that of a part (second part) adjacent to the end of the gradient coil. That is, in the drawings on the left in FIG. 3, (a) and (b), the gradient coil (GC) protrudes towards the inside at the parts where the RF coil does not exist along the z-axis direction (direction of the static magnetic field). Further, the connecting part between the first part and the second part has a tapered shape.

The RF shield 53 consists of a conductor part, and it is disposed between the gradient coil 51 and the birdcage type RF coil 52 so as to cover the periphery of the RF coil 52. The RF shield 53 has a shape consisting of a combination of cylindrical conductors having two different diameters so that the shape should fit the concave of the gradient coil 51.

Although sizes of the gradient coil 51 and the RF coil 52 are not particularly limited, for example, the ring part of the RF coil of FIG. 3, (a) may have a diameter of 60 cm, and in this case, the rung length (axial length along the z-axis direction) is 53 cm. If the length of imaging region is typically 35 cm along the z-axis direction, the rung length is about 1.5 times of the length of the imaging region along the z-axis direction. This relation satisfies the requirement for making non-homogeneity of sensitivity in the imaging region 30% or less at the time of excitation. The RF shield has a diameter of 60 cm at the opening thereof, and a diameter of 68 cm at the part covering the periphery of the rung part of the RF coil.

The rung length of the RF coil shown in FIG. 3, (b) is 40 cm, which is shorter than that of the coil unit shown in (a). If the axial length (rung length) of the RF coil is shortened to shorten the length of the concave for the axial direction as shown in the left drawing of FIG. 3, (b), performance of the gradient coil can be more improved. This is because a part having a wider space between the main coil for gradient magnetic field and the shield coil for gradient magnetic field becomes larger than that of the case shown in FIG. 3, (a). Moreover, since the main coil for gradient magnetic field disposed at the protruding part can be made closer to the center of the RF coil substantially corresponding to the center of the imaging region, performance of the gradient coil can be more improved.

However, if the axial length of the RF coil (rung length) is shortened, homogeneity of sensitivity distribution of the RF coil along the z-axis direction is degraded. In order to obtain a correct image of an imaging region, it is desired that non-homogeneity of sensitivity (non-homogeneity of RF power) in the imaging region should be 30% or less at the time of excitation. In order to make the non-homogeneity of sensitivity in an imaging region 30% or less at the time of excitation with using a birdcage type RF coil, the length of rungs is required to be about 1.5 times longer than the size of the imaging region along the z-axis direction. For example, when the axial length of RF coil (rung length) is shortened to 40 cm, the imaging region in which non-homogeneity of sensitivity is 30% or less will have a length of about 27 cm along the z-axis direction. That is, if it is assumed that the length of imaging region along the z-axis direction is typically 35 cm, the rung length of 40 cm is about 1.14 times the length of the imaging region along the z-axis direction. If the rung length is shortened to a length of about 1.14 times of the length of the imaging region along the z-axis direction, the length along the z-axis direction of the imaging region where non-homogeneity of sensitivity is 30% or less becomes smaller by about 23% compared with that obtained in the case shown in FIG. 3, (a).

According to this embodiment, by using the structure that the gradient coil (GC) protrudes towards the inside at the part where the RF coil does not exist, the interval between the main coil for the gradient magnetic field and the shield coil for the gradient magnetic field is increased at the part where the gradient coil protrudes (first part having a smaller internal diameter), and therefore it becomes possible to increase magnetic field generating efficiency. That is, gradient magnetic field intensity or rate of rise of the gradient magnetic field can be increased.

Moreover, since the part where the gradient coil protrudes (first part) and the part inside the foregoing part (second part) are connected with a portion having a tapered shape, mechanical strength of the RF shield is increased. Also in actual use of the gradient coil, the tapered shape for a portion connecting the parts having different internal diameters provides the effect of increasing the mechanical strength.

SECOND EMBODIMENT

The coil unit of this embodiment uses shapes of the gradient coil and the RF shield different from those used in the first embodiment. An example is shown in FIG. 4. In FIG. 4, the same elements as those of the foregoing embodiment are represented with the same numerals, and explanations thereof are omitted. As shown in the drawings, the gradient coil 55 and the RF shield 57 of the coil unit of this embodiment have slanting shapes for the inner sides. Such a gradient coil having a concave can be constituted by not only using a conductor of a cylindrical shape but also using a conductor having a shape obtained by connecting two truncated cones as the RF shield. That is, by using a shape of which internal diameter becomes smaller from the center to the end along the direction of the static magnetic field for the gradient coil and the RF shield, gradient coil and RF shield having a concave can also be constituted.

The coil units shown in FIGS. 4 (a) and (b) have the same configuration, except that the lengths of the rung parts of the RF coils 52 are different, and the internal inclinations of the RF shields 57 are correspondingly different. For example, the ring part of the RF coil shown in FIG. 4 (a) has a diameter of 60 cm, and the rung length (axial length along the z-axis direction) in this case is 53 cm. The diameter of the RF shield at the opening is the same as the diameter of the ring part of the RF coil, i.e., 60 cm. The maximum diameter of the RF shield is 68 cm. The ring part of the RF coil shown in FIG. 4 (b) has a diameter of 60 cm, and the rung length (axial length along the z-axis direction) in this case is 40 cm. The distance between the ring part conductor of the RF coil and the RF shield shown in FIG. 4 (b) is longer than that of the RF coil shown in FIG. 4 (a).

A case of installing such an RF coil as mentioned above in an MRI system having a static magnetic field intensity of 3 teslas, and using it at 128 MHz as the resonance frequency of hydrogen nucleus at 3 teslas was examined. In this case, if the rung length is 53 cm, the distance between the ring part of the RF coil and the RF shield becomes short, and radio frequency eddy currents increase to compensate the high frequency magnetic field. Therefore, high frequency magnetic field generating efficiency of the RF coil is degraded.

On the other hand, if the rung length is shortened as in the RF coil shown in FIG. 4 (b), there is provided an effect that high frequency magnetic field generating efficiency is increased by 15% or more compared with that of the RF coil shown in FIG. 4 (a). If the length of imaging region is typically 35 cm along the z-axis direction, the rung length of 40 cm is about 1.14 times the length of the imaging region along the z-axis direction. That is, if the rung length is shortened up to a length of about 1.14 times from about 1.5 times of the length of the imaging region along the z-axis direction as in the RF shield shown in FIG. 4, the high frequency magnetic field generating efficiency can be increased by 15% or more.

According to this embodiment, as in the first embodiment, it becomes possible to increase the magnetic field generating efficiency for the gradient magnetic field. In addition, by using the shape in which the internal diameter continuously changes, the main coil for gradient magnetic field can be made closer to the center of the RF coil substantially corresponding to the center of the imaging region, and therefore performance of the gradient coil can be more improved.

THIRD EMBODIMENT

Although the coil unit of this embodiment uses the same shapes of the gradient coil and the RF shield as those used in the second embodiment (FIG. 4), it is characterized in that there are provided a plurality of connecting parts which electrically connect the RF coil and the RF shield via capacitors. An example is shown in FIG. 5.

In FIG. 5 (a), the birdcage type RF coil 52 is provided with, in addition to two ring parts 501 existing in two planes substantially perpendicular to the direction of the static magnetic field (z), and rung parts 502 connected to the ring parts 501, four connecting parts 505-1, 505-2, 505-3 and 505-4, which connect the ring parts 501 and RF shield 57 via capacitors 504-1, 504-2, 504-3 and 504-4, respectively. The connecting parts are joined to junctions of the rings and rungs. In FIG. 5 (a), the birdcage type RF coil and the RF shield are joined via the capacitors and the connecting parts. Electric power is supplied from both ends of the capacitor 504-1, one of the four capacitors disposed in the connecting parts between the RF coil and the RF shield.

For example, the ring part of the RF coil shown in FIG. 5 has a diameter of 60 cm, and the rung length (axial length along the z-axis direction) is 40 cm. The number of rungs is 12. The RF shield has the same diameter as that of the ring part of the RF coil, 60 cm, at the opening. The maximum diameter of the RF shield is 68 cm. A case of installing such an RF coil as mentioned above in an MRI system using a static magnetic field intensity of 3 teslas, and using it at 128 MHz as the resonance frequency of hydrogen nucleus at 3 teslas was examined.

The sensitivity distribution along the z-axis of the birdcage type RF coil shown in FIG. 5 (a) is shown in FIG. 6 (a) with a solid line. The sensitivity distribution shown in FIG. 6 (a) with a broken line is sensitivity distribution of the birdcage type RF coil shown in FIG. 4 (b) along the z-axis. The homogenous sensitivity distribution region along the z-axis of the birdcage type RF coil shown in FIG. 5 (a) (double head arrow of solid line) is expanded by about 7% compared with the homogenous sensitivity distribution region along the z-axis of the birdcage type RF coil shown in FIG. 4 (b) (double head arrow of broken line). The homogenous sensitivity distribution region referred to here is defined to be a length of an imaging region along the z-axis direction within which non-homogeneity of sensitivity is 30% or less.

By connecting parts of the rings of the birdcage type RF coil and the RF shield via capacitors and supplying electric power from one of them, there is obtained an effect of improving homogeneity of sensitivity distribution. That is, the path of the high frequency current which flows in the RF shield is controlled by connecting the RF shield and the RF coil via capacitors, and thereby the sensitivity distribution is controlled to improve homogeneity of sensitivity distribution. Further, by connecting RF coil rungs, which exist in planes including the center of the RF coil and the RF coil/RF shield connecting parts at which an electric power supply point exists and parallel to the direction of the static magnetic field (z-axis direction), with the RF shield via capacitors and the connecting parts (connecting parts 505-2, 505-3 and 505-4), current which flows in the RF shield along the direction parallel to the direction of the static magnetic field (z-axis direction) can be increased, and thereby homogeneity of the sensitivity distribution along the z-axis direction can be improved.

A modified version of the coil unit of FIG. 5 (a) is shown in FIG. 5 (b). In FIG. 5 (b), there are shown ring parts, rung parts connected to the ring parts, and twelve connecting parts which connect the ring parts and the RF shield via capacitors, respectively. Also in this case, the connecting parts are joined to the junctions of the rings and the rungs. In FIG. 5 (b), 8 bonding parts of the ring parts and the rung parts on both sides of the four connecting parts 505-1, 505-2, 505-3 and 505-4 shown in FIG. 5 (a) are connected to the RF shield via capacitors and the connecting parts. Since the number of the rungs is twelve, the central angle between the RF coil/RF shield connecting part 505-1, in which an electric power supply point exists, and the adjacent RF coil/RF shield connecting part is substantially 30°. The RF coil/RF shield connecting parts 505-2, 505-3 and 505-4, each of which exists in a plane including the RF coil center and the RF coil/RF shield connecting part in which an electric power supply point exists and parallel to the direction of the static magnetic field (z-axis direction), are similarly disposed between the RF coil/RF shield connecting parts locating at positions, each of which is substantially 30° as a central angle apart from each of the RF coil/RF shield connecting parts 505-2, 505-3 and 505-4.

The sensitivity distribution along the z-axis of the birdcage type RF coil shown in FIG. 5 (b), in which equal capacities are set for the capacitors disposed in the rings of the birdcage coil and the capacitors disposed in the RF coil/RF shield connecting parts and which is tuned to 128 MHz, is indicated in FIG. 6 (b) with a solid line. The sensitivity distribution indicated with a broken line in FIG. 6 (b) is sensitivity distribution along the z-axis of the usual birdcage type RF coil shown in FIG. 4 (b). The homogenous sensitivity distribution region along the z-axis of the birdcage type RF coil shown in FIG. 6 (b) (double head arrow of solid line) is expanded by about 14% compared with the homogenous sensitivity distribution region along the z-axis of the usual birdcage type RF coil (double head arrow of broken line).

By connecting parts of the rings of the birdcage type RF coil and the RF shield via capacitors and connecting parts and supplying electric power from one of them, there is obtained an effect of improving homogeneity of sensitivity distribution. That is, the path of the high frequency current which flows in the RF shield is controlled by connecting the RF shield and the RF coil via capacitors, and thereby the sensitivity distribution is controlled to improve homogeneity of sensitivity distribution. Further, by employing a configuration that rungs of the RF coil which exist in planes including the center of the RF coil and the RF coil/RF shield connecting parts at which an electric power supply point exists and parallel to the direction of the static magnetic field (z-axis direction) are connected with the RF shield, and each connecting part exists between RF coil/RF shield connecting parts symmetrically disposed with respect to a plane parallel to the direction of the static magnetic field (z-axis direction), current which flows in the RF shield along the direction parallel to the direction of the static magnetic field (z-axis direction) can be increased, and thereby homogeneity of the sensitivity distribution along the z-axis direction can be improved. The RF coil/RF shield connecting parts are symmetrically disposed with respect to a straight line passing the center of the RF coil and substantially parallel to the direction of the static magnetic field (z-axis direction). The current which flows in the rungs or the RF shield thereby comes to have a symmetrical magnitude with respect to the electric power supply point, and therefore homogeneity of the sensitivity distribution for the x-y plane can be improved.

The sensitivity distribution along the z-axis of the birdcage type RF coil shown in FIG. 5 (b), in which the capacitors disposed in the connecting part of the rings and the RF shield have a capacity larger than the capacities of the capacitors disposed in the rings and which is tuned to 128 MHz is shown in FIG. 6 (c) with a solid line. The capacity of each of the capacitors disposed in the RF coil/RF shield connecting parts was 20 pF, the capacity of each of the capacitors disposed in the rings was 5 pF, and the coil was tuned to 128 MHz. The sensitivity distribution indicated with a broken line in FIG. 6 (c) is the sensitivity distribution along the z-axis of the birdcage type RF coil shown in FIG. 4 (b). The center value in the sensitivity distribution along the z-axis of the birdcage type RF coil shown in FIG. 6 (c) (solid line) is decreased by about 3% compared with that of the sensitivity distribution along the z-axis of the birdcage type RF coil shown in FIG. 4 (b) (broken line). On the other hand, the homogenous sensitivity distribution region along the z-axis of the birdcage type RF coil shown in FIG. 6 (c) (double head arrow of solid line) is expanded by about 25% compared with the homogenous sensitivity distribution region along the z-axis of the birdcage type RF coil shown in FIG. 4 (b) (double head arrow of broken line).

By connecting parts of the rings of the birdcage type RF coil and the RF shield via capacitors and connecting parts and supplying electric power from one of them, there is obtained an effect of improving homogeneity of sensitivity distribution. That is, the path of the high frequency current which flows in the RF shield is controlled by connecting the RF shield and the RF coil via capacitors, and thereby the sensitivity distribution is controlled to improve homogeneity of sensitivity distribution. Further, by employing a larger capacity for the capacitors disposed in the birdcage type RF coil/RF shield connecting part, current which flows in the RF shield can be increased, and thereby homogeneity of the sensitivity distribution along the z-axis direction can be improved.

A modified version of the coil unit of FIG. 5 is shown in FIG. 7 (a). In FIG. 7 (a), there are shown ring parts, rung parts connected to the ring parts, and twelve connecting parts which connect the ring parts and the RF shield via capacitors, respectively. That is, the RF shield is connected to the birdcage type RF coil via the capacitors and the connecting parts at twelve positions. Also in this case, the 12 connecting parts are joined to the junctions of the rings and rungs.

In the coil unit shown in FIG. 7 (a), the RF coil/RF shield connecting parts 505-1, 505-2, 505-3 and 505-4, which exist in planes including the center of the RF coil and the RF coil/RF shield connecting parts at which an electric power supply point exists and parallel to the direction of the static magnetic field (z-axis direction), are each disposed between the RF coil/RF shield connecting parts (8 connecting parts) locating at positions substantially 60° as a central angle apart from each of the RF coil/RF shield connecting parts 505-1, 505-2, 505-3 and 505-4 with regard to the coil center.

The sensitivity distribution along the z-axis of the birdcage type RF coil shown in FIG. 7 (a) in which the capacitors disposed in the RF coil/RF shield connecting parts have a capacity of 20 pF, and the capacitors disposed in the rings have a capacity of 7 pF, and which is tuned to 128 MHz, is shown in FIG. 7 (b) with a solid line. The sensitivity distribution indicated with a broken line in FIG. 7 (b) is the sensitivity distribution along the z-axis of the birdcage type RF coil shown in FIG. 4 (b). The homogenous sensitivity distribution region along the z-axis of the birdcage type RF coil shown in FIG. 7 (a) (double head arrow of solid line) is expanded by about 15% compared with the homogenous sensitivity distribution region along the z-axis of the birdcage type RF coil shown in FIG. 4 (b) (double head arrow of broken line). Thus, degree of expansion of homogenous sensitivity distribution region depends on the central angle between the RF coil/RF shield connecting part, at which an electric power supply point exists, and each of the two RF coil/RF shield connecting parts disposed along the circle of the ring of the RF coil on both sides of the foregoing RF coil/RF shield connecting part.

A graph showing the relationship between degree of expansion of homogenous sensitivity distribution region and the central angle between the RF coil/RF shield connecting part, at which an electric power supply point exists, and each of the RF coil/RF shield connecting parts disposed on both sides of the foregoing RF coil/RF shield connecting part, is shown in FIG. 8. The horizontal axis represents the central angle α between the RF coil/RF shield connecting part, at which an electric power supply point exists, and each of the RF coil/RF shield connecting parts disposed on both sides of the foregoing RF coil/RF shield connecting part with regard to the ring center. The vertical axis represents expansion of homogenous sensitivity distribution region in a birdcage type RF coil provided with RF coil/RF shield connecting parts, indicated in terms of percentage based on the length of homogenous sensitivity distribution region along the z-axis of a corresponding birdcage type RF coil in which the RF coil and the RF shield are not connected (non-connected state), which is taken as 100%. It can be seen that, when the angle α is 10 to 60 degrees, the expansion of homogenous sensitivity distribution region became 15% or larger. Thus, by making the angle between the ring center to the RF coil/RF shield connecting part, at which an electric power supply point exists, and each of the RF coil/RF shield connecting parts disposed on both sides of the foregoing RF coil/RF shield connecting part 10 to 60 degrees, there is obtained an effect that the homogeneity of sensitivity distribution can be especially improved.

Further, by changing the capacities of the capacitors disposed in the RF coil/RF shield connecting parts, sensitivity distribution in a plane substantially perpendicular to the z-axis (direction of the static magnetic field) can be changed. FIG. 9 shows sensitivity distributions along the y axis obtained with changing capacities of the capacitors disposed in RF coil/RF shield connecting parts to be 10 pF, 20 pF, 30 pF and 40 pF, which are represented with a broken line, solid line, alternate long and short dash line, and alternate long and two short dashes line, respectively.

The sensitivity distribution represented with the broken line in FIG. 9 is the sensitivity distribution along the y-axis of the birdcage type RF coil shown in FIG. 4 (b). When the capacities of the capacitors disposed in RF coil/RF shield connecting parts were changed, the coil unit was tuned to 128 MHz by adjusting capacities of the capacitors disposed in the rings. From FIG. 9, it can be seen that, when capacities of the capacitors disposed in the RF coil/RF shield connecting parts were changed to be 10 pF, 20 pF, 30 pF and 40 pF, sensitivity distribution along the y-axis changed. It can be seen that as capacities of the capacitors disposed in the RF coil/RF shield connecting parts are increased, sensitivity at coordinates distant from the origin on the y-axis decreases. By using variable capacity capacitors as the capacitors disposed in the RF coil/RF shield connecting parts, and providing a mechanism for adjusting capacities of the variable capacity capacitors, sensitivity distribution can be changed to a desired profile. For example, excitation of panniculus adiposus on abdominal or back surface of a subject can be intentionally reduced to enhance sensitivity for a deep abdominal part.

FOURTH EMBODIMENT

The coil unit of this embodiment has a gradient coil and an RF shield having substantially the same shapes as those used in the first embodiment (FIG. 3), but it is characterized by being provided with a plurality of connecting parts which electrically connect the RF coil and the RF shield via capacitors. An example is shown in FIG. 10.

In the coil unit shown in FIG. 10 (a), left drawing, the gradient coil protrudes towards the inside the cylinder at the parts where the RF coil does not exist (parts having smaller diameter) along the z-axis direction. That is, the internal diameter of the first part that covers the periphery of a rung part of the RF coil is larger than the internal diameter of the second parts in the vicinity of the ends of the gradient coil where the RF coil does not exist. By using such a configuration, the space between the main coil for gradient magnetic field and the shield coil for gradient magnetic field is widened at the parts where the gradient coil protrudes, therefore it becomes possible to increase magnetic field generating efficiency, and gradient magnetic field intensity or rate of rise of the gradient magnetic field can be thereby increased. A connecting part between the first part and the second part has a tapered shape.

Further, like the coil unit shown in FIG. 5, the RF coil is a birdcage type RF coil having twelve rungs, parts of the rings and the RF shield are connected via capacitors and connecting parts, and electric power is supplied from one of them.

For example, the ring part diameter of the RF coil of FIG. 10 (a) is 60 cm, and the rung length (axial length along the z-axis direction) thereof is 30 cm.

The axial length (rung length) of the RF coil shown in FIG. 10 (a) is shorter than that of the RF coil shown in FIG. 3, (b) (rung length is 40 cm). Therefore, ratio of the part where the gradient coil protrudes toward the inside relative to the total length of the gradient magnetic field is larger in the gradient coil shown in FIG. 10 (a) by about 15%, compared with the gradient coil shown in FIG. 3, (b), and hence it can further enhance the magnetic field generating efficiency of the gradient coil.

The sensitivity distribution of the above coil unit, in which the capacitors disposed in the rings have a capacity of 7 pF, and the capacitors disposed in the RF coil/RF shield connecting parts have a capacity of 30 pF, and which is tuned to 128 MHz, is shown in FIG. 10 (b). The sensitivity distribution represented with the solid line is the sensitivity distribution of the birdcage type RF coil shown in FIG. 10 (a) along the z-axis. The sensitivity distribution represented with the broken line in FIG. 10 (b) is the sensitivity distribution along the z-axis of the birdcage type RF coil not having the RF coil/RF shield connecting parts. It can be seen that homogeneity of sensitivity distribution along the z-axis direction is greatly improved, whereas when there are no RF coil/RF shield connecting part, homogeneity of sensitivity distribution along the z-axis direction is degraded. Thus, by connecting parts of the rings of the birdcage type RF coil and the RF shield via capacitors and supplying electric power from one of them, there is obtained an effect of improving homogeneity of sensitivity distribution.

FIFTH EMBODIMENT

Another embodiment of the birdcage type RF coil having RF coil/RF shield connecting parts will be explained with reference to FIG. 11. The RF coil shown in FIG. 11 has, for example, a ring part diameter of the RF coil of 60 cm, and a rung length (axial length along the z-axis direction) of 40 cm. The number of rungs is twenty four.

In the RF coil shown in FIG. 11, a plurality of RF coil/RF shield connecting parts are disposed along the circle of the ring of the RF coil, so that the RF coil/RF shield connecting part 505-1 where an electric power supply point exists is disposed between the RF coil/RF shield connecting parts 505-5 and 505-5' as well as the RF coil/RF shield connecting parts 505-6 and 505-6' locating at positions apart 30° and 45° as a central angle from the RF coil/RF shield connecting part 505-1, respectively, around the ring center.

The RF coil/RF shield connecting part 505-2, which exists in a plane including the RF coil center and the RF coil/RF shield connecting part 505-1 where an electric power supply point exists and substantially parallel to the direction of the static magnetic field (z-axis direction), is also disposed between the RF coil/RF shield connecting parts 505-7 and 505-7', and 505-8 and 505-8', which are disposed on the circle of the ring of the RF coil at positions apart 30° and 45° as a central angle from the RF coil/RF shield connecting part 505-1, respectively, around the ring center. With this configuration, substantially the same sensitivity distribution can be obtained as that obtained by disposing RF coil/RF shield connecting parts on both sides the RF coil/RF shield connecting part 505-1, where an electric power supply point exists, at positions apart 37.5° (=(30+45)/2) as a central from the connecting part 505-1 around the coil center. This is because the path of current which flows in the RF shield observed in the configuration of the RF coil/RF shield connecting parts shown in FIG. 11 becomes similar to the path of current which flows in the RF shield observed in the configuration where the RF coil/RF shield connecting parts are disposed on each side of the RF coil/RF shield connecting part, where an electric power supply point exists, at position apart 37.5° as a central angle from the latter around the ring center. If the number of the connecting parts is increased, number of parts increases to make the configuration complicated. However, the number of rungs can be only an integer as a multiple of 4. Therefore, if the same sensitivity distribution as that obtained by providing an RF coil/RF shield connecting part between substantially two rungs is desired as in the aforementioned example, it can be realized by using a configuration that a plurality of RF coil/RF shield connecting parts are disposed on each side of an RF coil/RF shield connecting part where an electric power supply point exists.

By disposing a plurality of RF coil/RF shield connecting parts on each side of an RF coil/RF shield connecting part, which exists in a plane including the RF coil center and an RF coil/RF shield connecting part where an electric power supply point exists and substantially parallel to the direction of the static magnetic field (z-axis direction), there is also obtained an effect of improving homogeneity of sensitivity distribution along the z-axis direction.

SIXTH EMBODIMENT

An embodiment of the birdcage type RF coil having RF coil/RF shield connecting parts to which the QD method is applied will be explained with reference to FIG. 12. The RF coil shown in FIG. 12 has, for example, a ring part diameter of 60 cm, and a rung length (axial length along the z-axis direction) of 40 cm. The number of rungs is twenty four. It is tuned to 128 MHz, which is the resonance frequency of hydrogen nucleus at a static magnetic field intensity of 3 teslas.

The birdcage type RF coil having RF coil/RF shield connecting parts shown in FIG. 12 has two electric power supply points 35-1 and 35-2. A plurality of the connecting parts are disposed along the circle of the ring of the RF coil, so that the RF coil/RF shield connecting parts should be disposed on each side of each of the RF coil/RF shield connecting parts 505-10 and 505-20, where each of the electric power supply points exists, at position apart 30° as a central angle from the RF coil/RF shield connecting part 505-10 or 505-20 around the ring center respectively. With this configuration, homogeneity of sensitivity distribution along the z-axis direction can be improved, and homogeneity of sensitivity distribution along the x-y plane can also be improved, compared with the corresponding birdcage type RF coil which does not have RF coil/RF shield connecting part. Moreover, SN ratio is theoretically improved by √2 times at the time of reception, compared with the case of using only one electric power supply point. This is because if signals obtained from one port (electric power supply point) and signals obtained from the other port, of which phases are delayed by about 90°, are added, magnitudes of the signals are doubled, but noises increases only by √2 times. Moreover, since circularly polarized waves are irradiated for irradiation of a high frequency magnetic field, electric power is halved, and thus heat generation due to high frequency heating in human body can be reduced.

When the QD method is carried out with a usual multiple patch resonator (e.g., the one described in Patent document 2) having a coil of a large size like a transmitting coil, it is common to transmit and receive pulses from four electric power supply ports locating at positions each of which shifts by 90 degrees from the adjacent position with phases shifted by 90 degrees from those of the pulses transmitted/received at the adjacent electric power supply port. In contrast, if this embodiment is used, the QD method can be carried out by transmitting and receiving pulses of which phases are different by 90° in two electric power supply ports, in spite of carrying out the QD method with an RF coil having a large size at a high frequency of 128 MHz. The reason is as follows. Since multiple patch resonators generally have no ring part, electromagnetic independency of a plurality of the rungs becomes high, and electric power supply at the rung of the position of 0 degree is unlikely to influence the current of the rung locating at the position of 180 degrees (locating at an opposing position). However, in this embodiment, since there are ring parts, electric power supplied to a rung of the position of 0 degree can affect current of a rung of the position of 180 degrees (locating at an opposing position). A small number of the electric power supply ports in the QD method provides a reduced production cost and easy adjustment for use.

A modified version of the sixth embodiment is shown in FIG. 13. The RF coil shown in FIG. 13 has, for example, a ring part diameter of 60 cm, and a rung length (axial length along the z-axis direction) of 40 cm. The number of rungs is twenty four. It is tuned to 128 MHz, which is the resonance frequency of hydrogen nucleus at a static magnetic field intensity of 3 teslas. The birdcage type RF coil having RF coil/RF shield connecting parts shown in FIG. 13 has two electric power supply points 35-1 and 35-2. On two planes, each including the center of the RF coil and the RF coil/RF shield connecting part 505-10 or 505-20, in which an electric power supply point exists, and parallel to the direction of the static magnetic field (z-axis direction), (two planes perpendicular to the drawing plane and perpendicularly intersecting with each other), there are eight RF coil/RF shield connecting parts in total. In addition to the eight RF coil/RF shield connecting parts, there are other eight RF coil/RF shield connecting parts at positions between the foregoing eight RF coil/RF shield connecting parts (16 connecting parts in total). In this RF coil, the RF coil/RF shield connecting part 505-10 where one electric power supply point exists is disposed between the RF coil/RF shield connecting parts locating at positions apart 45° as a central angle from the RF coil/RF shield connecting part 505-10 around the ring center. Further, the RF coil/RF shield connecting part 505-20 where the other electric power supply point exists is also disposed between the RF coil/RF shield connecting parts locating at positions apart 45° as a central angle from the RF coil/RF shield connecting part 505-20 around the ring center. And one of the RF coil/RF shield connecting parts on both sides of one electric power supply point also serves as one of the RF coil/RF shield connecting parts on both sides of the other electric power supply point (part indicated as 35-3 in FIG. 13). This RF coil operates as an RF coil corresponding to an RF coil in which RF coil/RF shield connecting part where an electric power supply point exists is disposed between RF coil/RF shield connecting parts locating at positions apart 45° as a central angle from the RF coil/RF shield connecting part, where an electric power supply point exists, around the ring center and the same RF coil disposed with an angle shifted by 90° from that of the foregoing RF coil, to which the QD method is applied. Since this embodiment uses fewer number of RF coil/RF shield connecting parts compared with the embodiment shown in FIG. 12, it has an effect that it can reduce production cost.

Another modified version of the sixth embodiment is shown in FIG. 14. The RF coil shown in FIG. 14 has, for example, a ring part diameter of 60 cm, and a rung length (axial length along the z-axis direction) of 40 cm. The number of rungs is twenty four. It is tuned to 128 MHz, which is the resonance frequency of hydrogen nucleus at a static magnetic field intensity of 3 teslas.

The birdcage type RF coil having RF coil/RF shield connecting parts shown in FIG. 14 has two electric power supply points 35-1 and 35-2. Each of the RF coil/RF shield connecting parts 505-10 and 505-20 is disposed between the RF coil/RF shield connecting parts locating at positions apart 30° as a central angle from one of the foregoing RF coil/RF shield connecting parts around the ring center. With this configuration, homogeneity of sensitivity distribution along the z-axis direction can be improved, and homogeneity of sensitivity distribution along the x-y plane can also be improved, compared with the corresponding birdcage type RF coil which does not have RF coil/RF shield connecting part. Since the number of rungs is twelve, all the rungs are connected with the RF shield as a result. When the QD method is carried out with a usual multiple patch resonator (e.g., the one described in Patent document 2) having a coil of a large size like a transmitting coil, it is common to transmit and receive pulses from four electric power supply ports locating at positions each of which shifts by 90 degrees from the adjacent position with phases shifted by 90 degrees in those of pulses obtained from the adjacent electric power supply port. In contrast, if this embodiment is used, the QD method can be carried out by transmitting and receiving pulses of which phases are different by 90° from two electric power supply ports, in spite of carrying out the QD method with an RF coil having a large size at a high frequency of 128 MHz. The reason is as follows. Since usual multiple patch resonators have no ring part, electromagnetic independency of the multiple rungs becomes high, and adjustment at one port is unlikely to influence the current in a remote rung. However, in this embodiment, since there are ring parts, adjustment at one port can affect current of a remote rung. A small number of the electric power supply ports in the QD method provides a reduced production cost and easy adjustment at the time of use.

This coil unit exhibits the same effects as those of the coil unit shown in FIG. 12, and performances of them are substantially equivalent. However, this embodiment further exhibits an effect that production cost can be reduced because of the fewer number of the rungs.

Although the present invention is explained for the specific embodiments mentioned above, the effect of improving homogeneity of sensitivity distribution along the z-axis direction can be similarly obtained also in coils of other configurations by disposing an RF coil/RF shield connecting part, which exists in a plane including RF coil center and an RF coil/RF shield connecting part where an electric power supply point exists and parallel to the direction of the static magnetic field (z-axis direction), between RF coil/RF shield connecting parts. For example, even in a birdcage coil in which the gradient coil does not have a concave, and the RF shield consists of a cylindrical conductor, such as the coil shown in FIG. 15, sensitivity distribution of the birdcage coil can be improved by providing RF coil/RF shield connecting parts.

INDUSTRIAL APPLICABILITY

The RF coil of the present invention can be used as a part of an MRI system, and can also be used for any instruments that use electromagnetic waves having a frequency of from several megahertz to several gigahertz.

DESCRIPTION OF NOTATIONS

Figure 1:
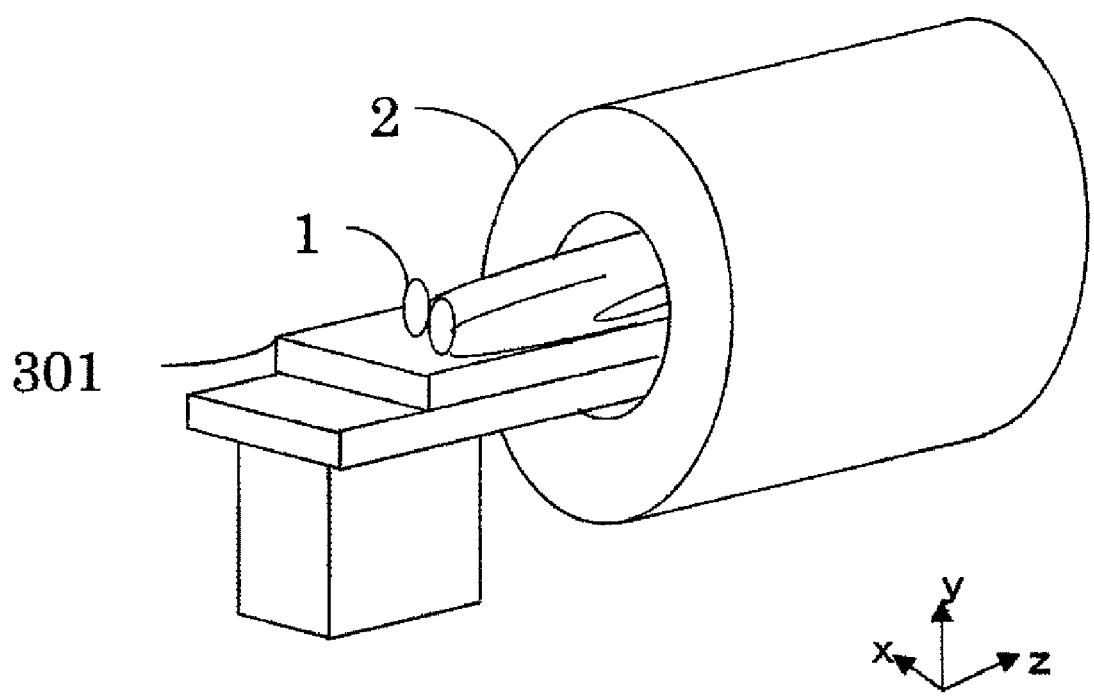
FIG. 1 A drawing showing schematic view of magnetic resonance imaging system.
Figure 2:
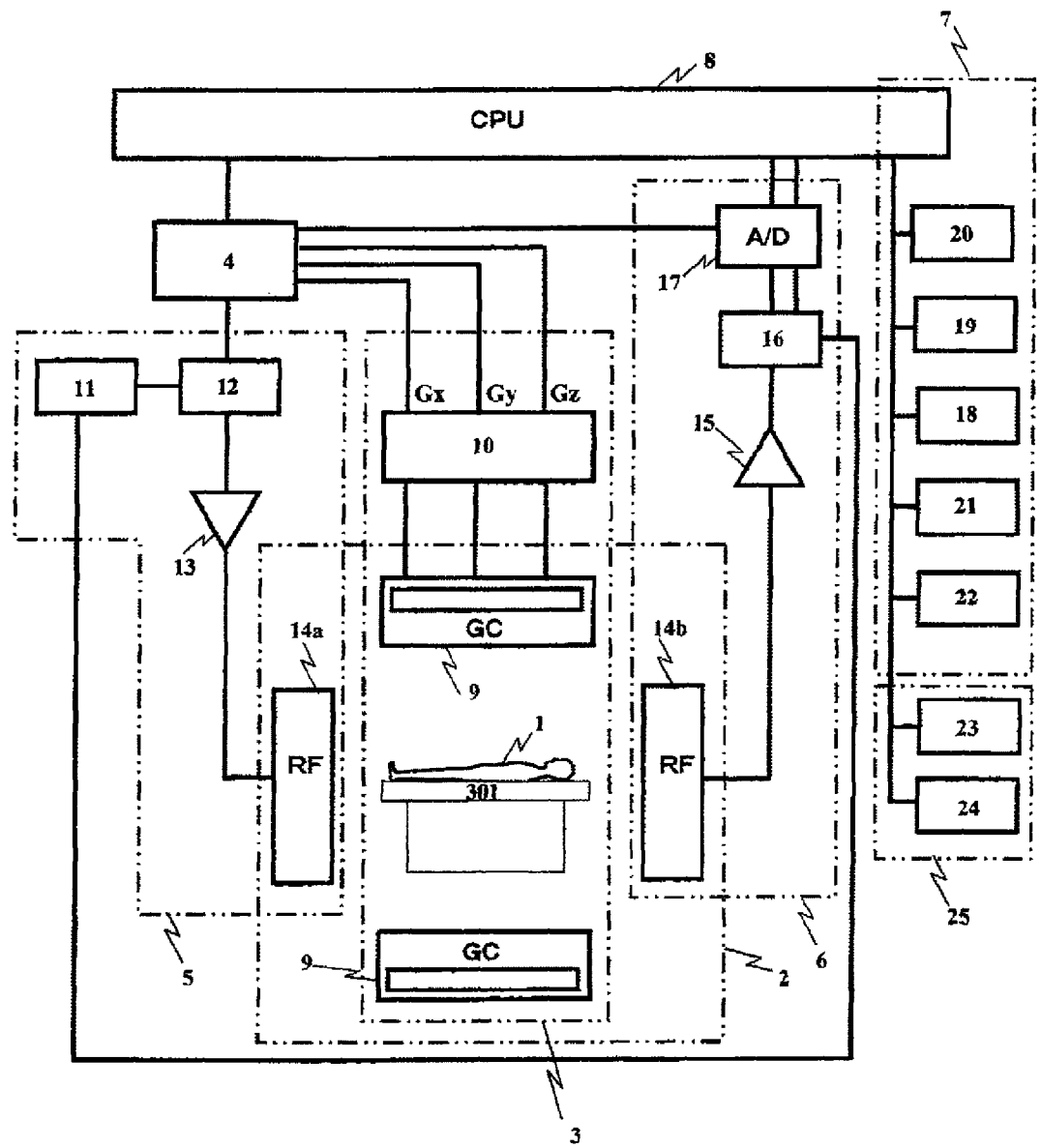
FIG. 2 A block diagram showing outline of MRI system to which the present invention is applied.
Figure 3:
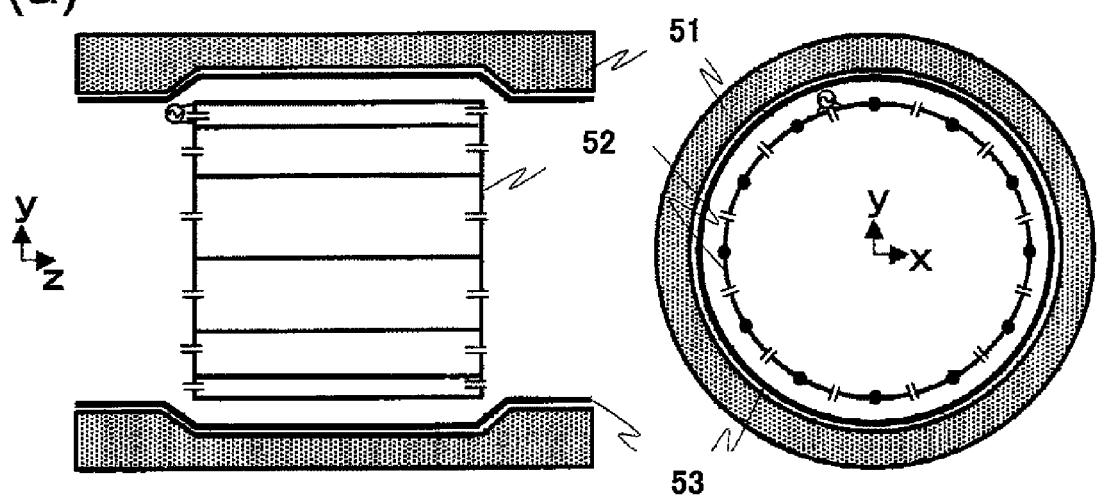
FIG. 3 Drawings showing an embodiment (first embodiment) of gradient coil having a concave and an RF coil located in the concave.
Figure 3:
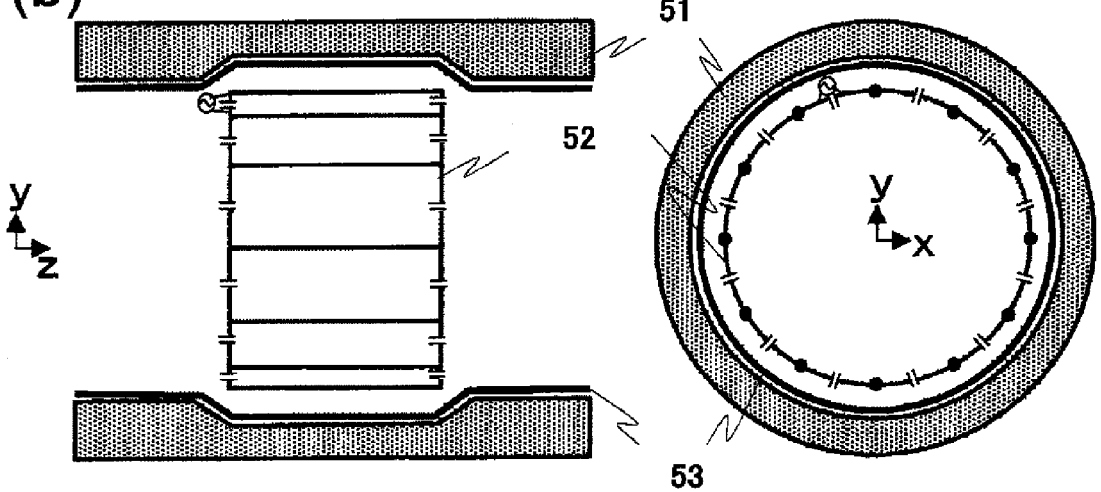
Figure 4:
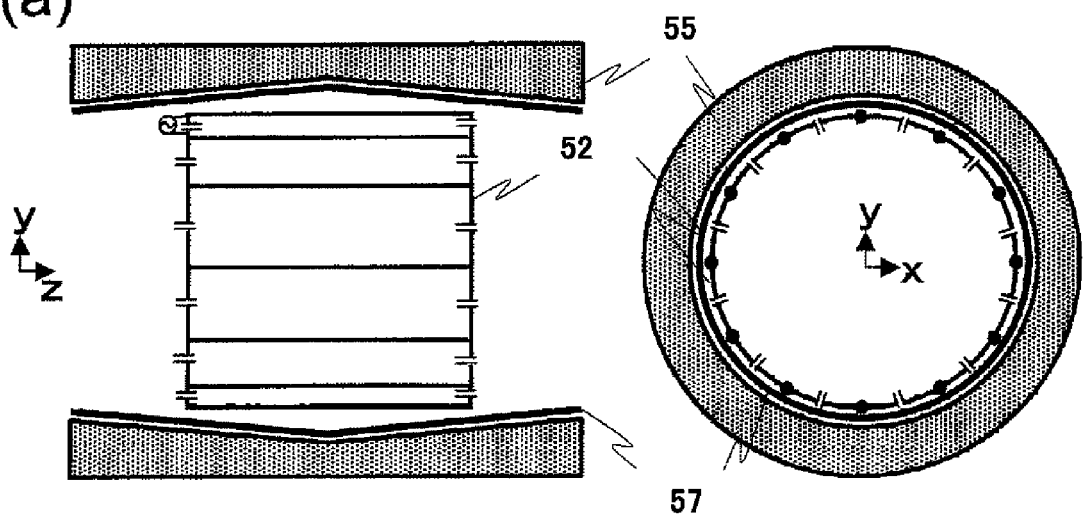
FIG. 4 Drawings showing an embodiment (second embodiment) of gradient coil having a concave and an RF coil located in the concave.
Figure 4:
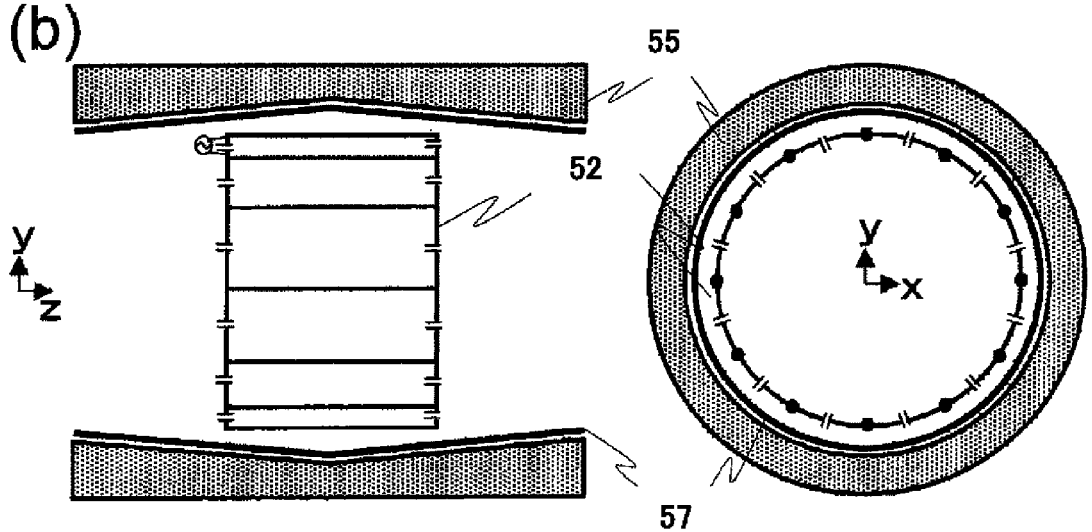
Figure 5:
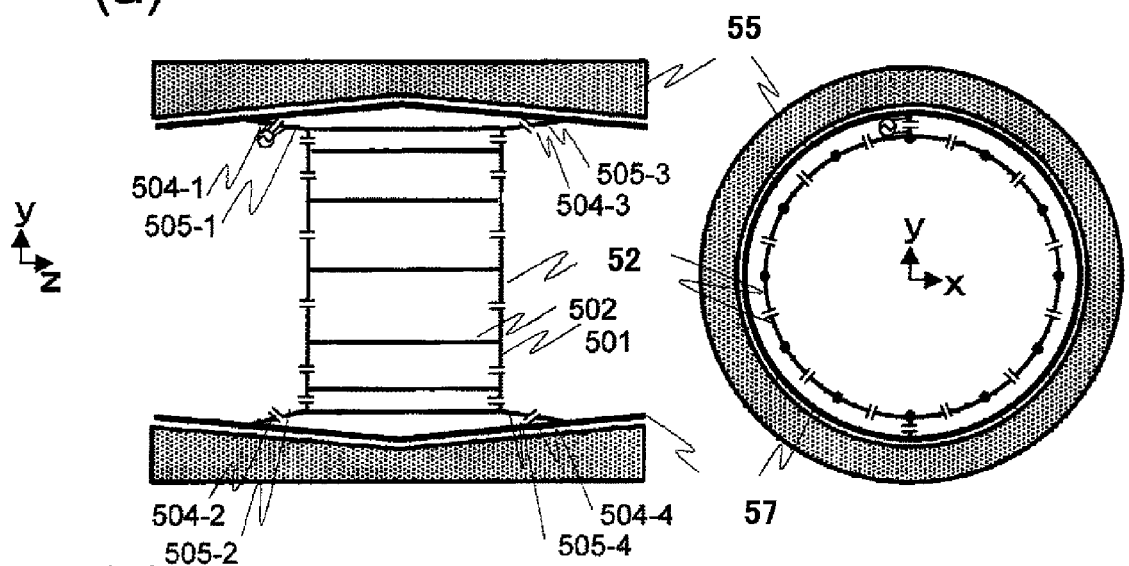
FIG. 5 Drawings showing an embodiment (third embodiment) of coil unit having RF coil/RF shield connecting parts according to the present invention.
Figure 5:
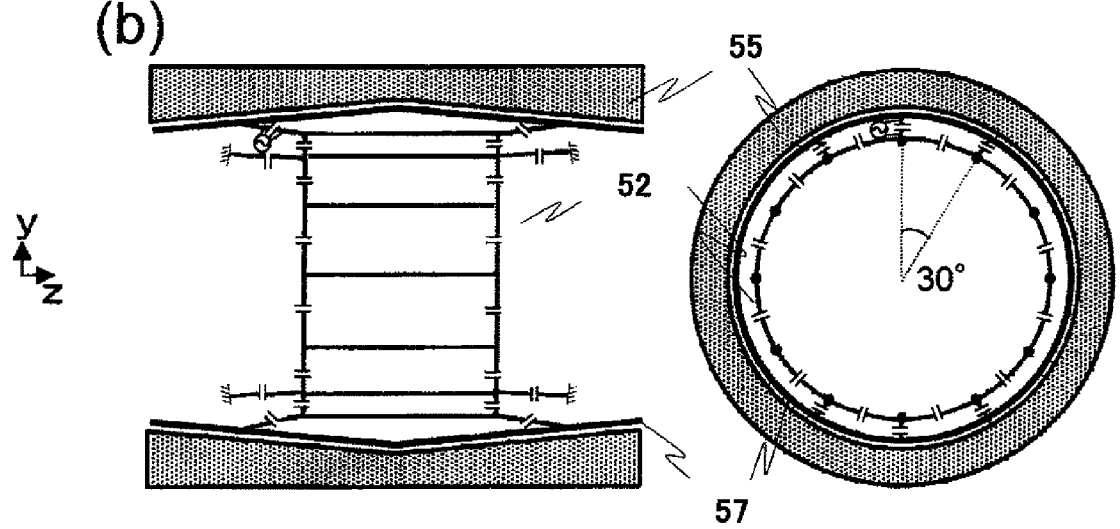
Figure 6:
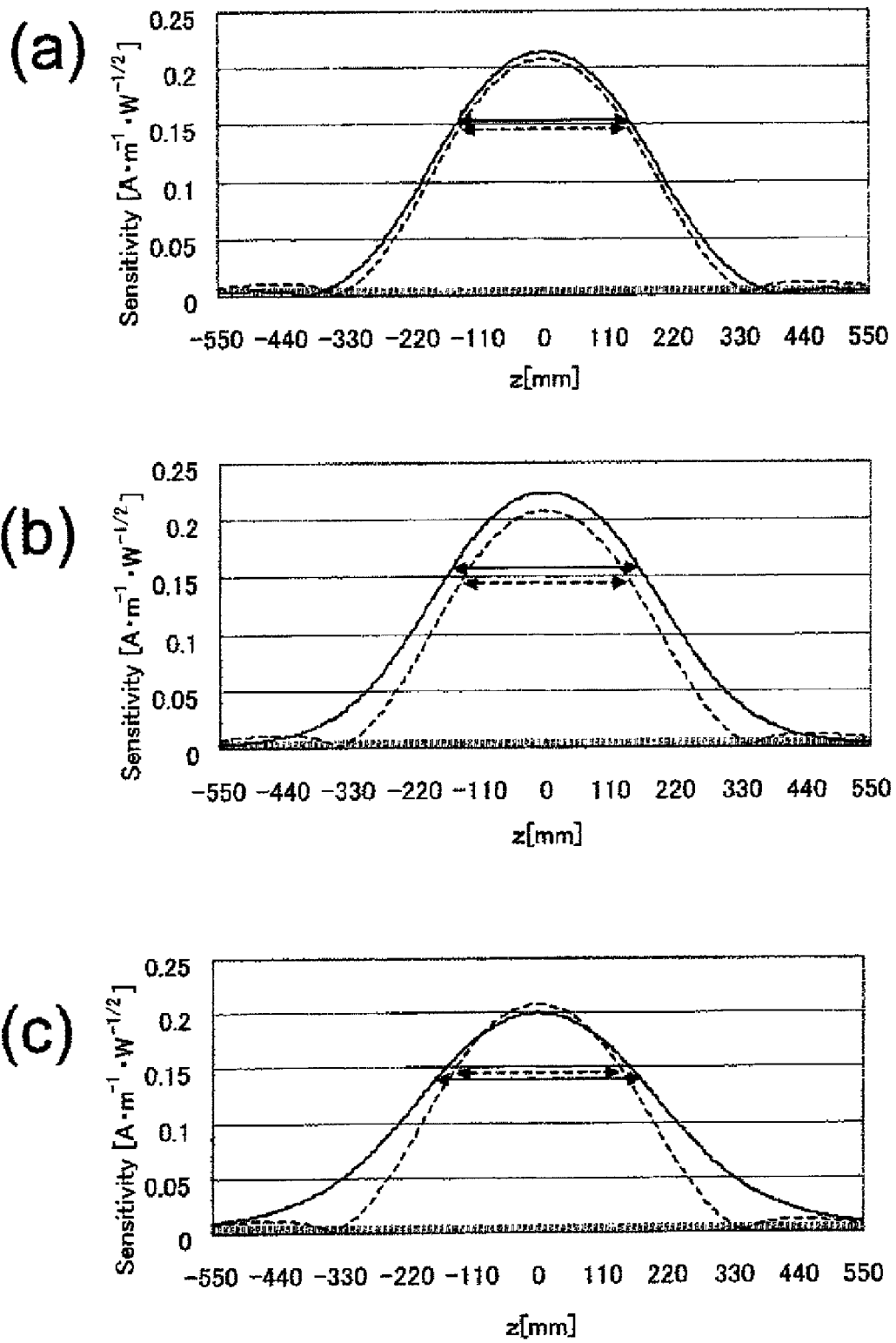
FIG. 6 Graphs showing examples of sensitivity distribution of the RF coil of the present invention.
Figure 7:
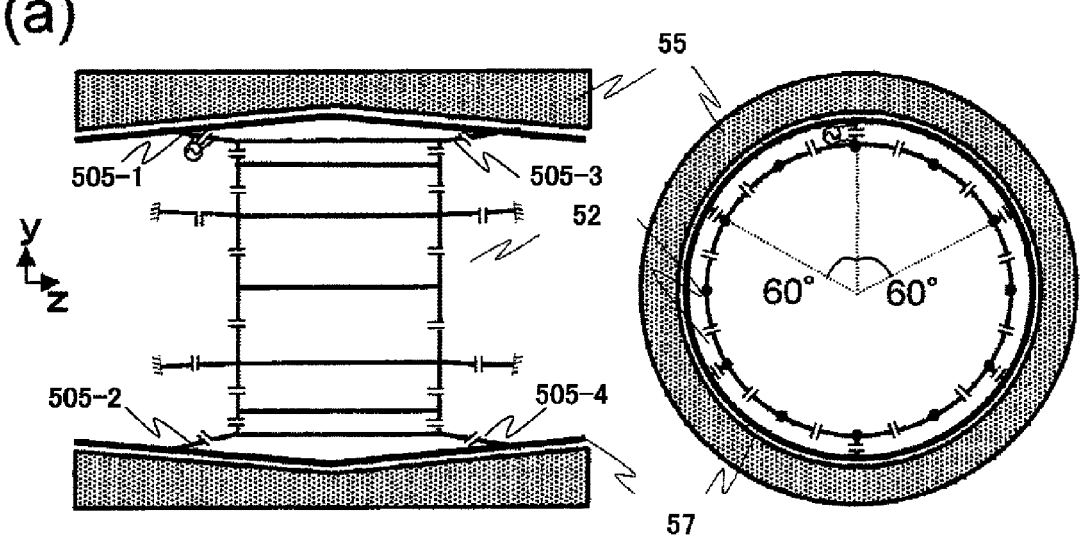
FIG. 7 Drawings showing an example of modified version of the coil unit of the third embodiment and a graph showing sensitivity distribution thereof.
Figure 7:
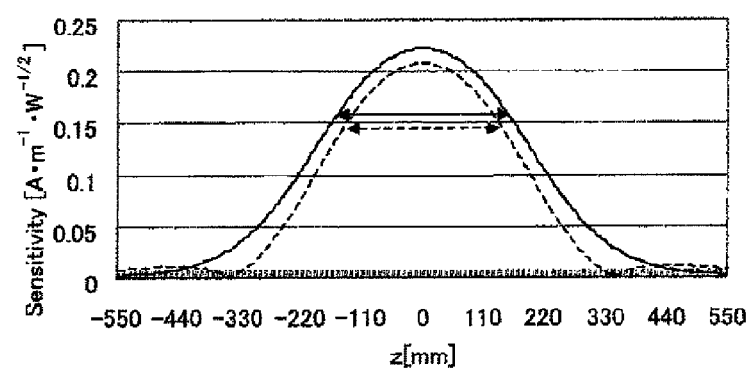
Figure 8:
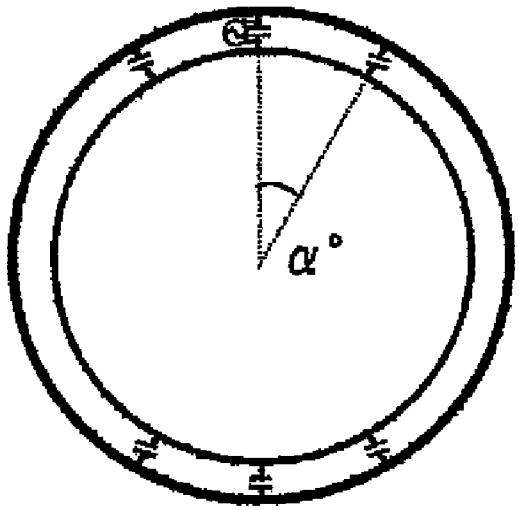
FIG. 8 A drawing and graph showing relationship between position of RF coil/RF shield connecting part in the coil unit of the present invention and expansion degree of homogenous sensitivity distribution region.
Figure 8:
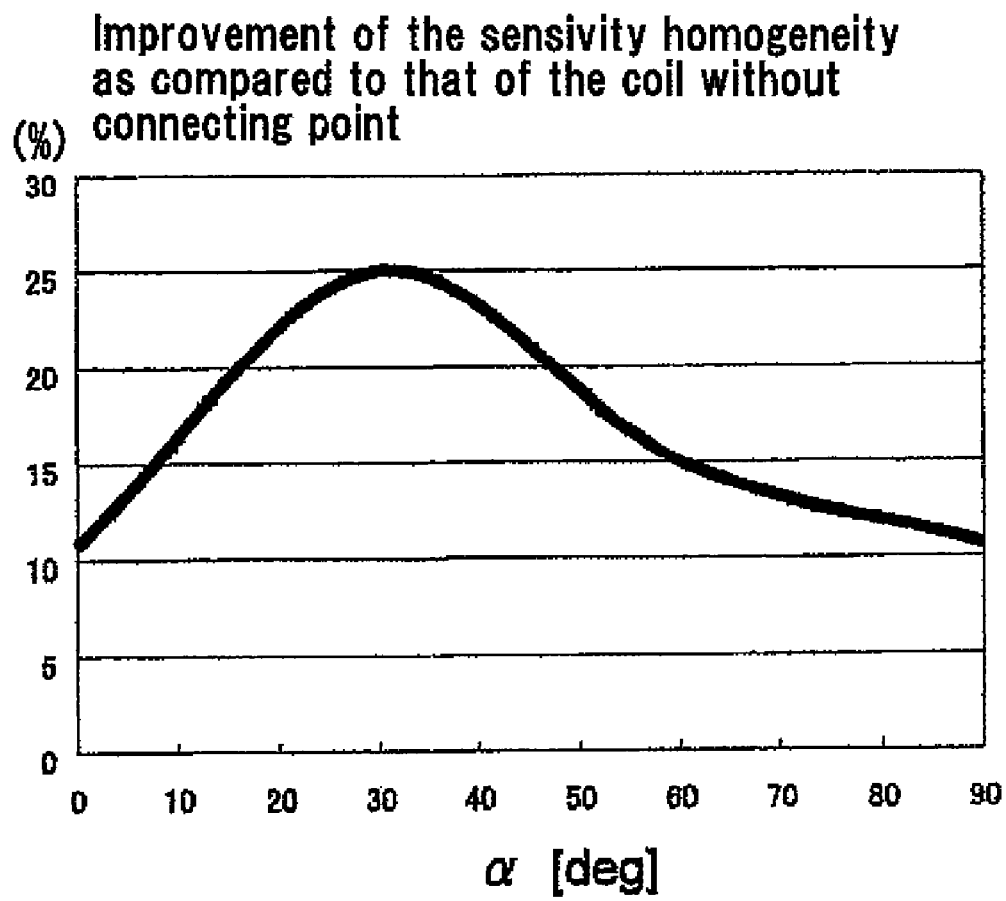
Figure 9:
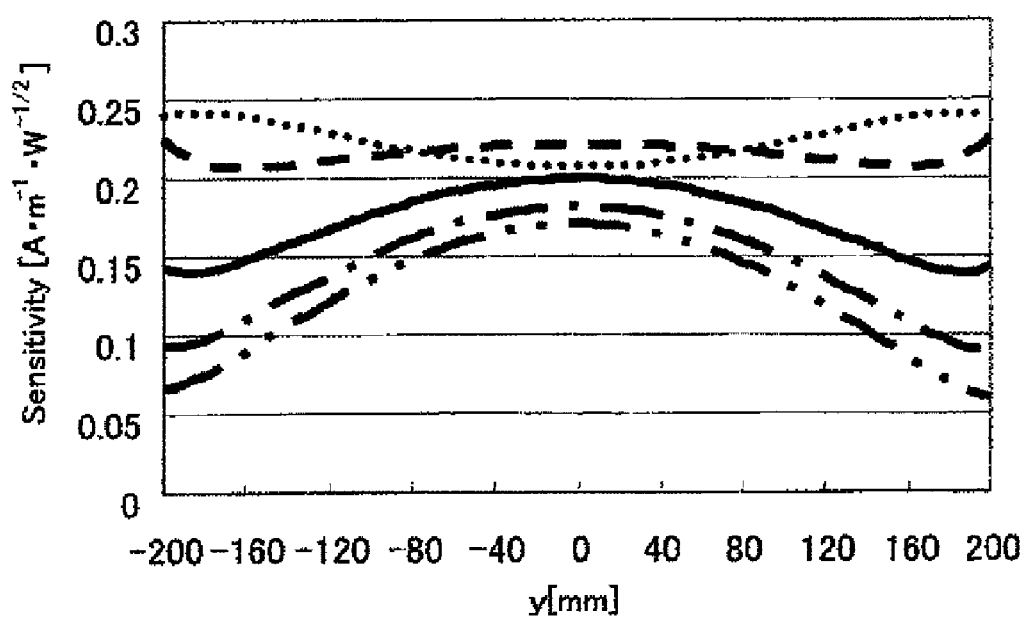
FIG. 9 A graph showing sensitivity distribution of the RF coil of the present invention.
Figure 10:
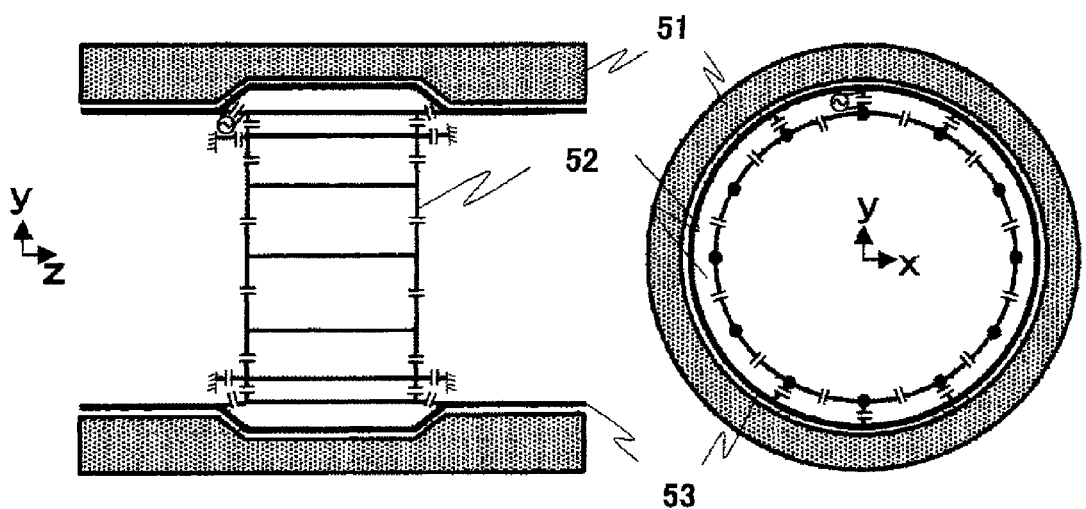
FIG. 10 Drawings showing an embodiment of the coil unit of the present invention (fourth embodiment) and a graph showing sensitivity distribution thereof.
Figure 10:
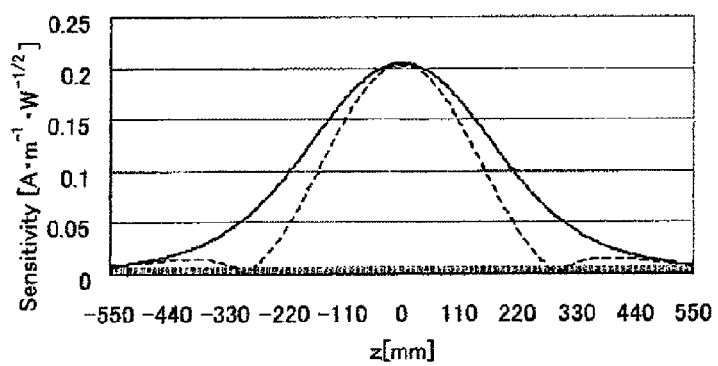
Figure 11:
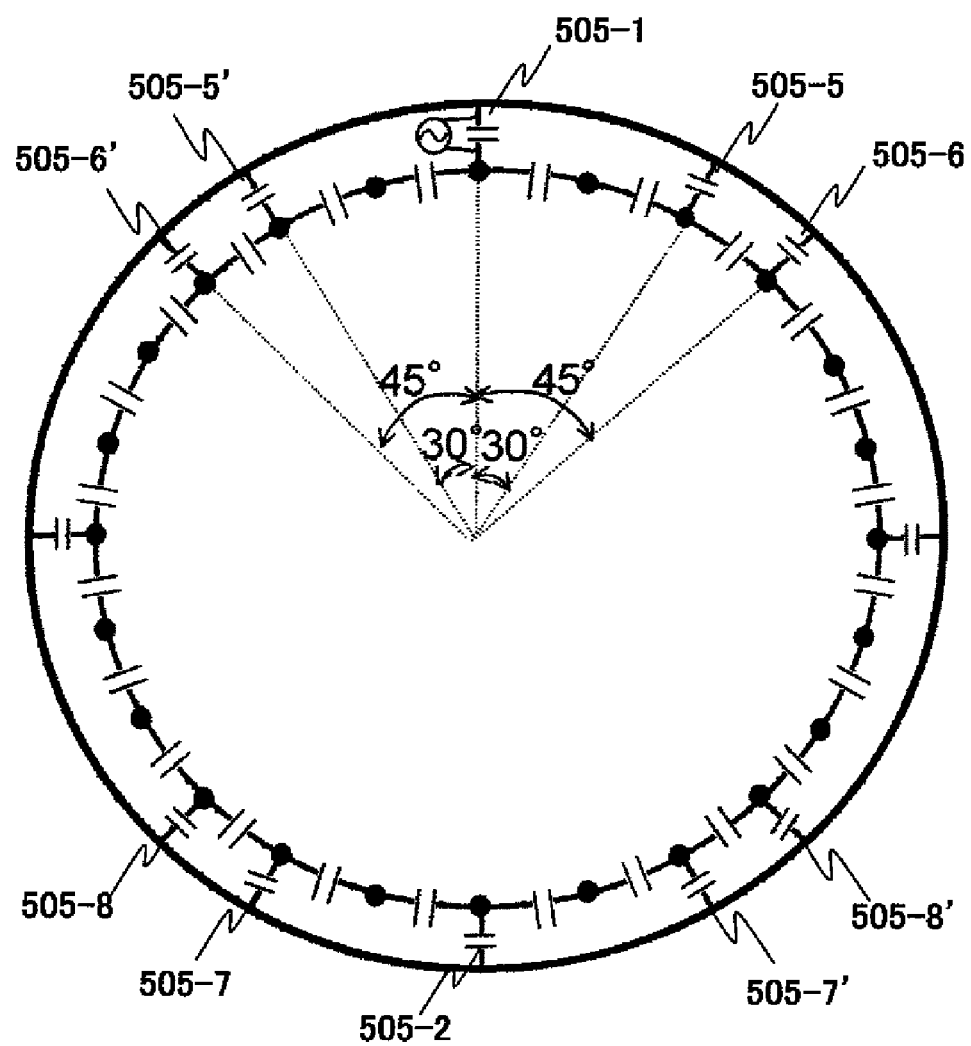
FIG. 11 A drawing showing an embodiment of the coil unit of the present invention (fifth embodiment).
Figure 12:
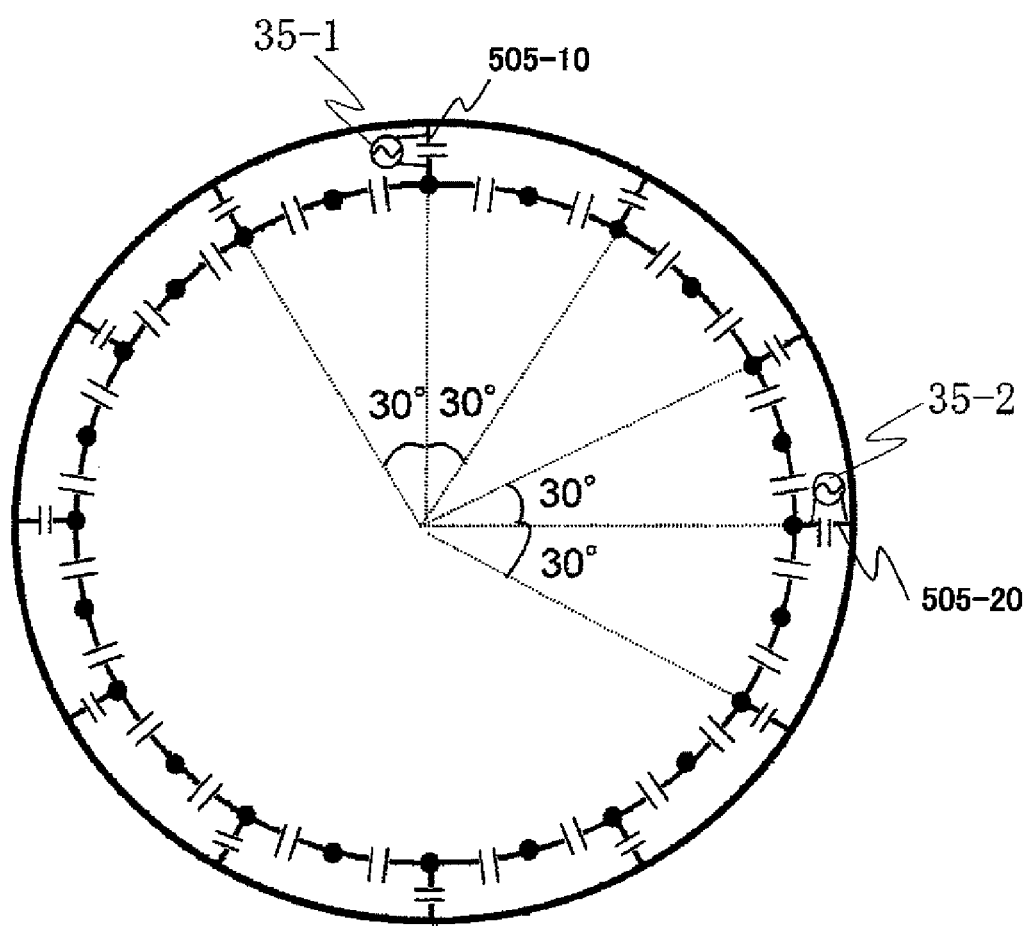
FIG. 12 A drawing showing an embodiment of the RF coil of the present invention to which QD method is applied (sixth embodiment).
Figure 13:
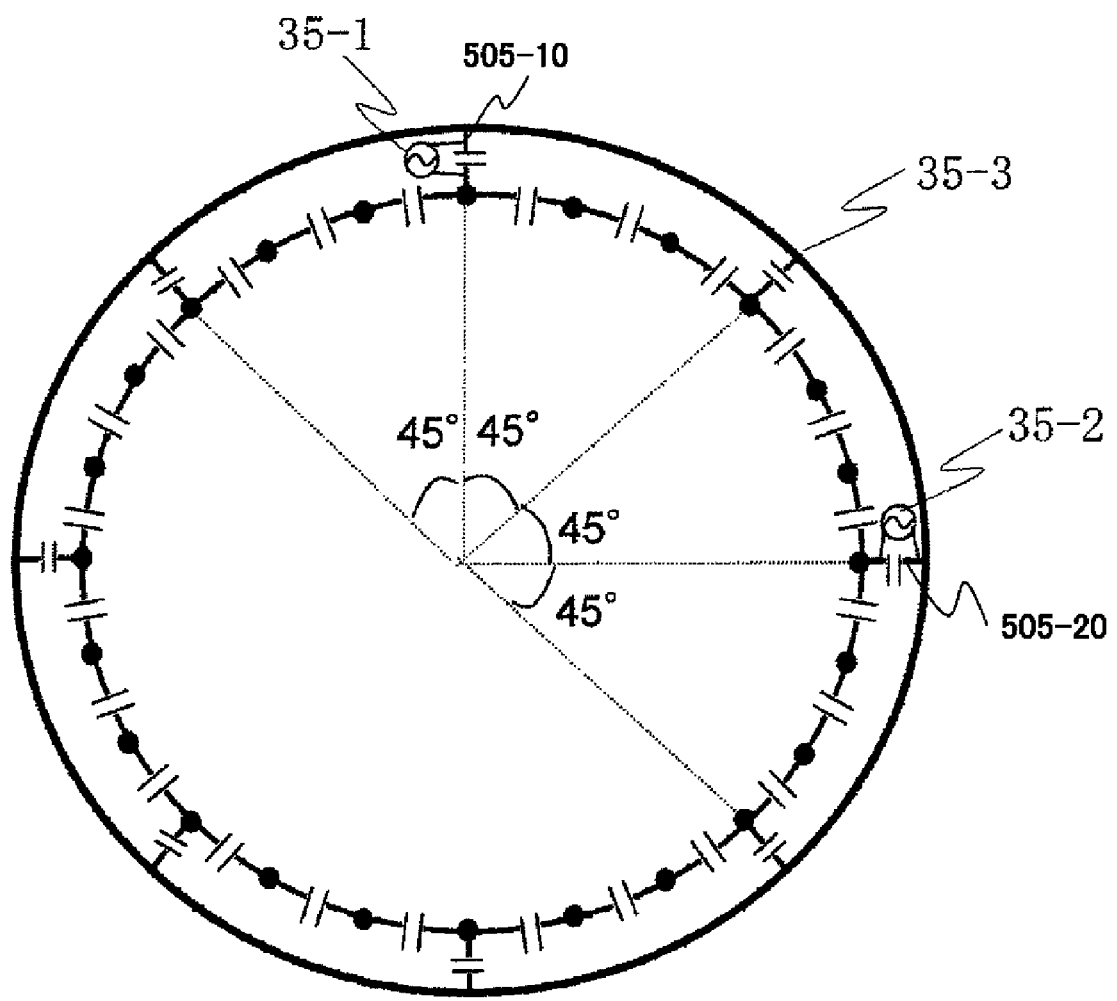
FIG. 13 A drawing showing an embodiment of the RF coil of the present invention to which QD method is applied (modified version of the sixth embodiment).
Figure 14:
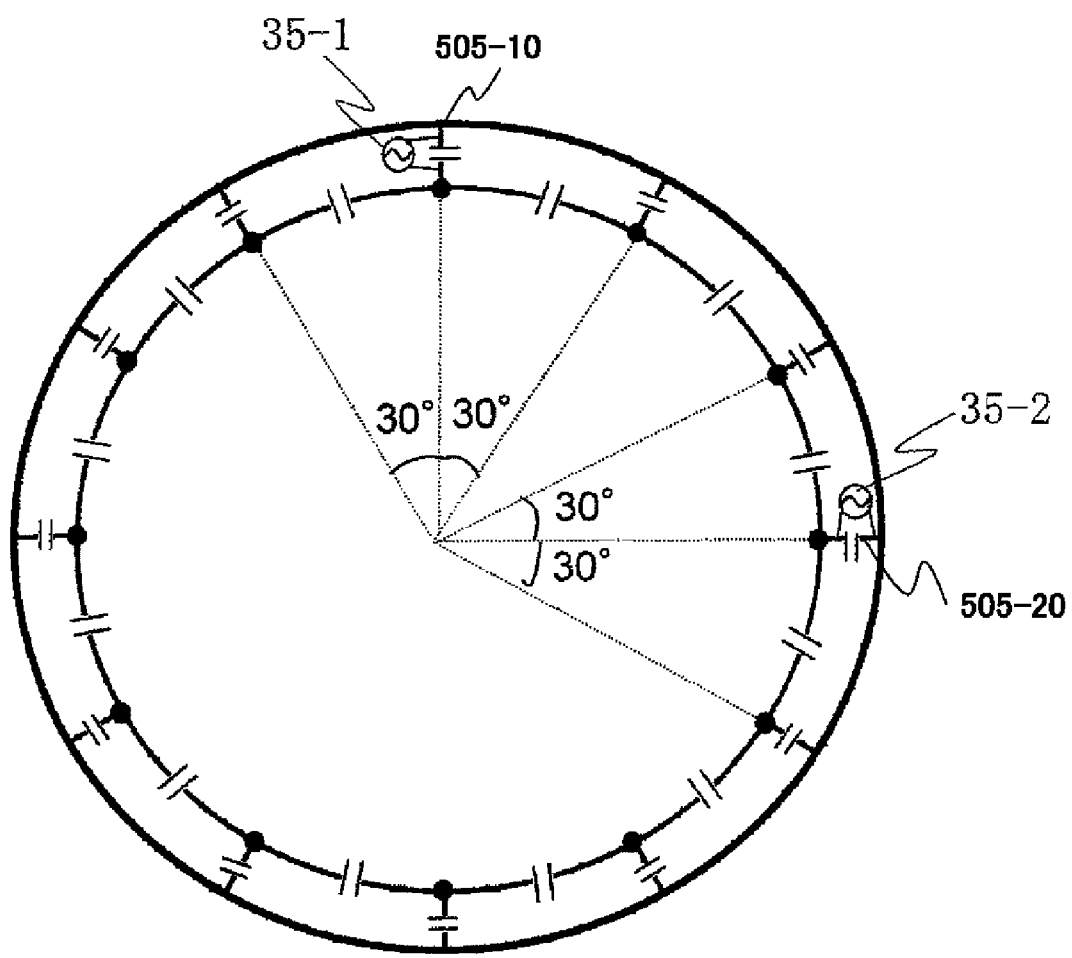
FIG. 14 A drawing showing an embodiment of the RF coil of the present invention to which QD method is applied (modified version of the sixth embodiment).
Figure 15:
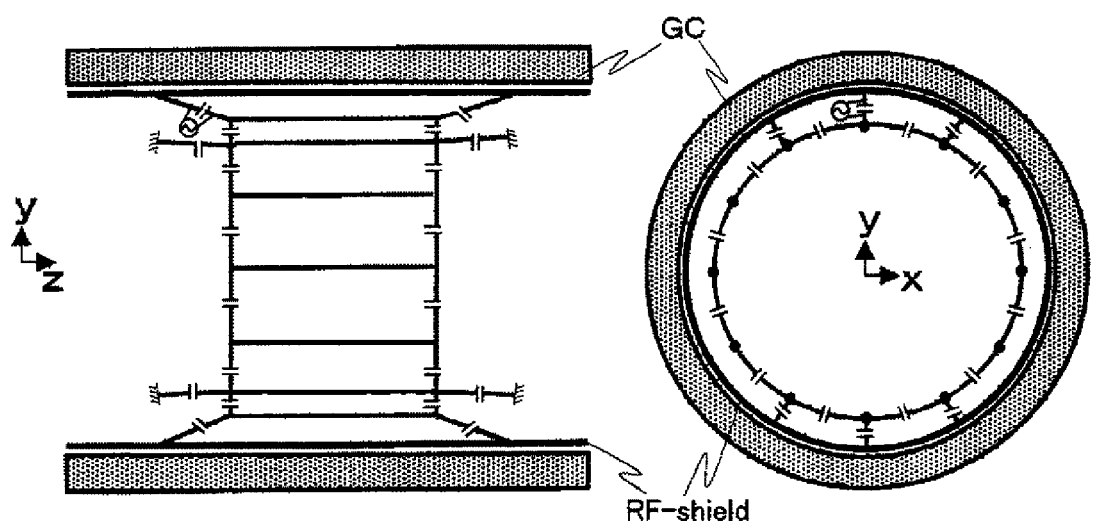
FIG. 15 Drawings showing an embodiment of the birdcage type RF coil of the present invention.
Figure 16:
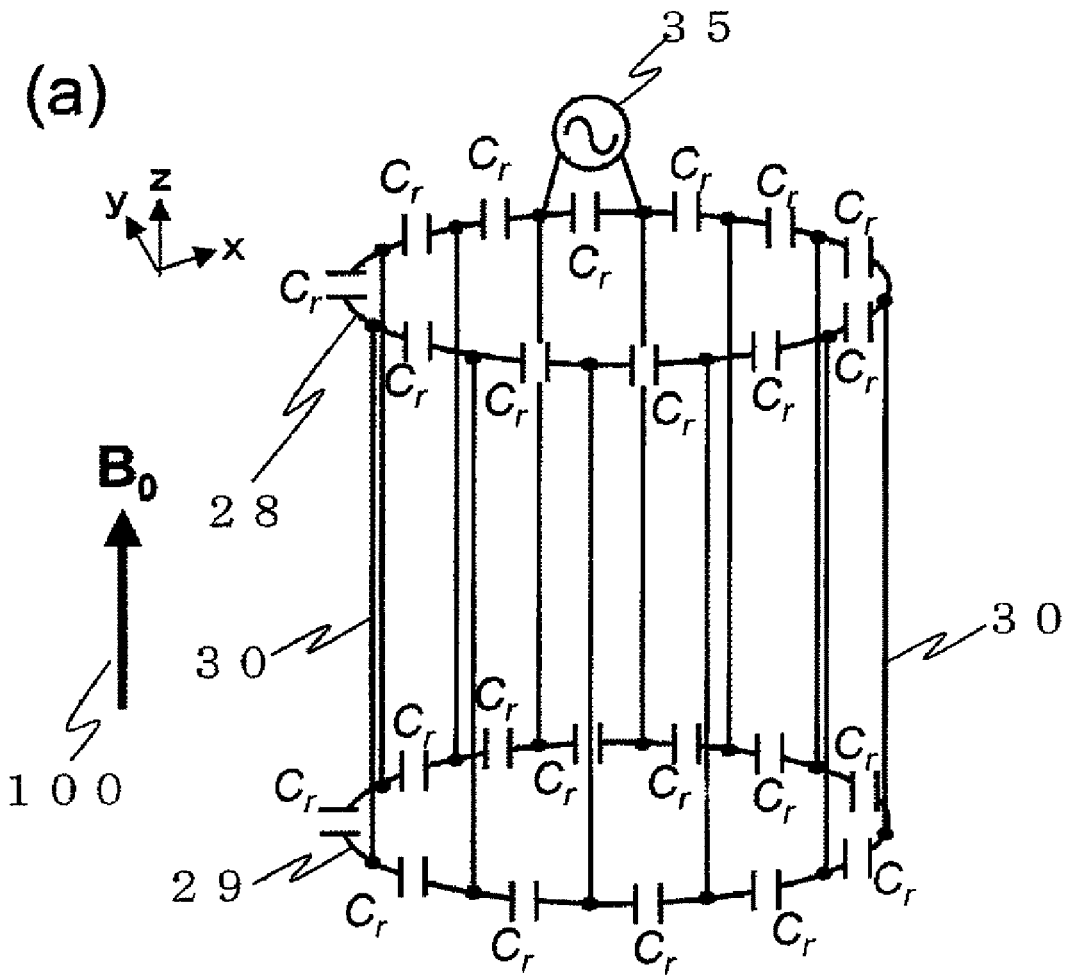
FIG. 16 Drawings showing conventional birdcage type RF coil.
Figure 16:
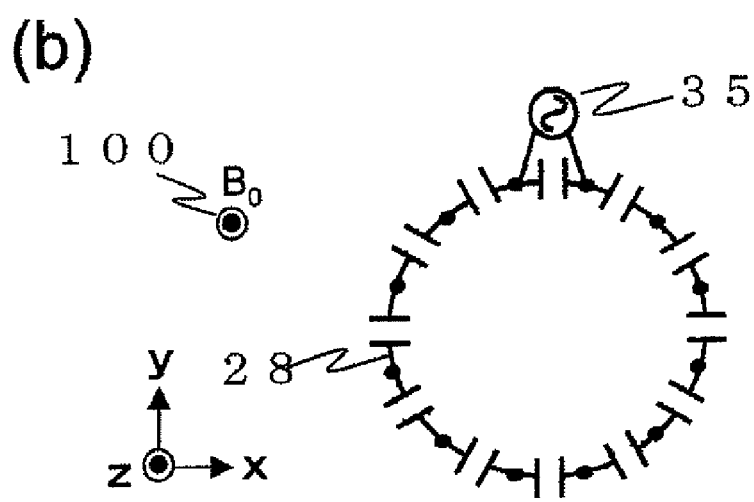
Figure 17:
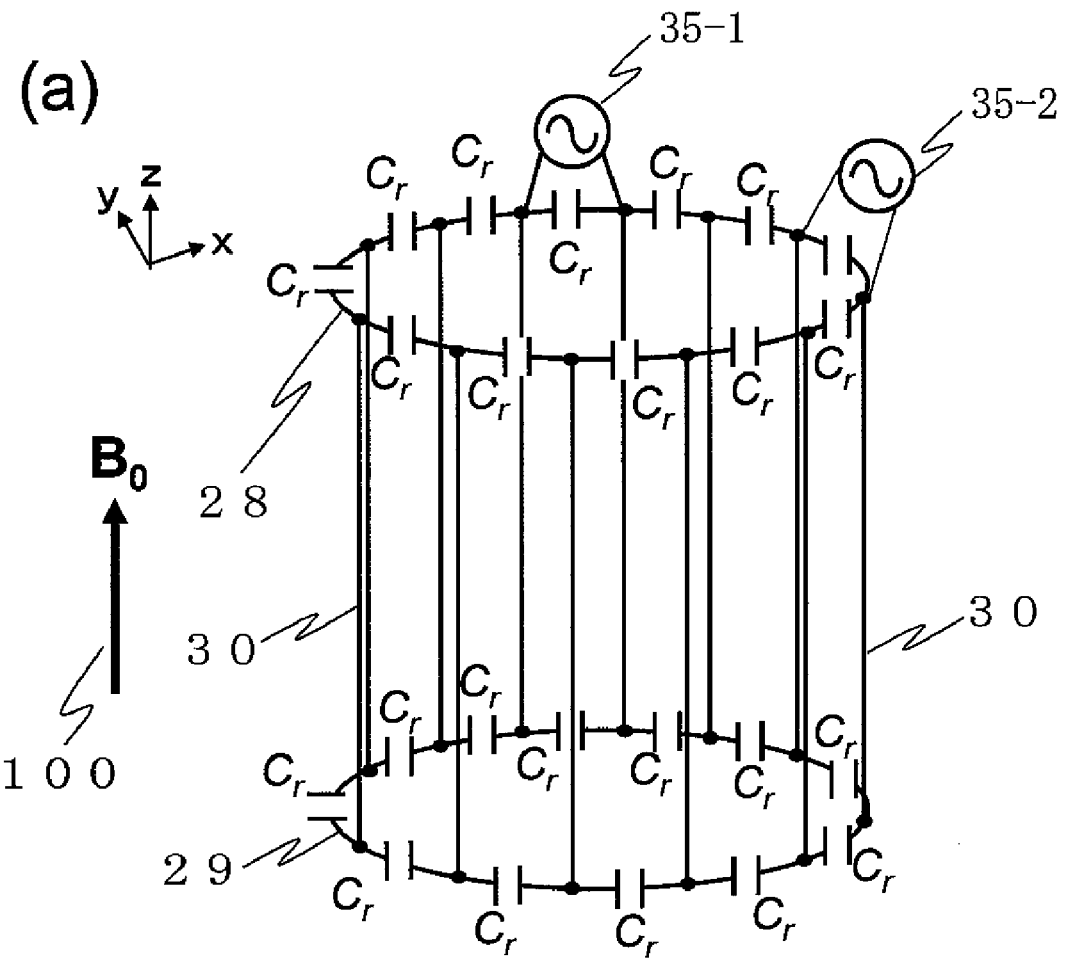
FIG. 17 Drawings showing conventional birdcage type RF coil to which QD method is applied.
Figure 17:
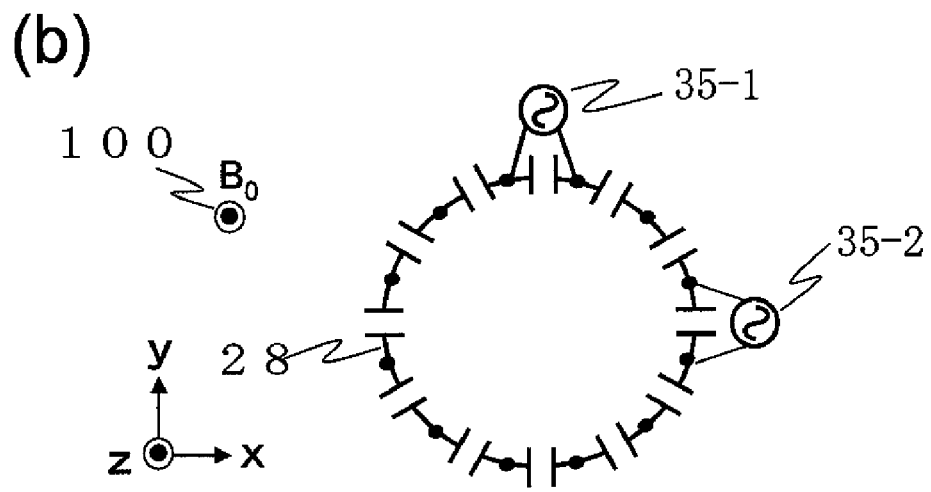

1 . . . subject, 2 . . . static magnetic field generating system, 3 . . . gradient magnetic field generating system, 4 . . . sequencer, 5 . . . transmitting system, 6 . . . receiving system, 7 . . . signal processing system, 8 . . . central processing unit (CPU), 9 . . . gradient coil, 10 . . . gradient magnetic field power supply, 11 . . . radio frequency oscillator, 12 . . . modulator, 13 . . . radio frequency amplifier, 14$a$ . . . radio frequency coil (transmitting coil), 14$b$ . . . radio frequency coil (receiving coil), 15 . . . signal amplifier, 16 . . . quadrature phase detector, 17 . . . A/D converter, 18 . . . magnetic disc, 19 . . . optical disc, 20 . . . display, 21 . . . ROM, 22 . . . RAM, 23 . . . trackball or mouse, and 24 . . . keyboard.

The invention claimed is:

1. A nuclear magnetic resonance imaging system comprising:
a static magnetic field generating source of a cylindrical shape which generates a static magnetic field,
a gradient coil which is disposed along the static magnetic field generating source in a test region surrounded by the static magnetic field generating source,
a radio frequency coil which is disposed along the gradient coil in the test region at a position closer to the center of the test region compared with the gradient coil, and comprises a first loop coil and a second loop coil locating in planes substantially perpendicular to direction of the static magnetic field, a plurality of linear conductors connecting the first loop coil and the second loop coil and substantially parallel to the direction of the static magnetic field, and a plurality of first capacitors disposed in the first loop coil, the second loop coil and/or the linear conductors, and
a conductor part which is disposed between the gradient coil and the radio frequency coil, and covers periphery of the radio frequency coil, wherein:
the nuclear magnetic resonance imaging system comprises a plurality of connecting parts which electrically connect the radio frequency coil and the conductor part via capacitors, and an electric power supply circuit installed in at least one of the plurality of connecting parts and connected in parallel to the capacitor in the connecting part.

2. The nuclear magnetic resonance imaging system according to claim 1, wherein:
the connecting parts are provided between the first loop coil and the conductor part and between the second loop coil and the conductor part, respectively.

3. The nuclear magnetic resonance imaging system according to claim 2, wherein:
each of the first connecting part, the second connecting part, the third connecting part, the fourth connecting part, the fifth connecting part and the sixth connecting part is joined to any of a plurality of the junctions of the first loop coil and a plurality of the linear conductors, and a plurality of junctions of the second loop coil and a plurality of the linear conductors.

4. The nuclear magnetic resonance imaging system according to claim 1, which comprises:
a first connecting part which connects the radio frequency coil and the conductor part via a second capacitor, and comprises an electric power supply circuit disposed in parallel to the second capacitor, and
a second connecting part which connects the radio frequency coil and the conductor part via a third capacitor.

5. The nuclear magnetic resonance imaging system according to claim 4, which further comprises:
a third connecting part which connects the radio frequency coil and the conductor part via a fourth capacitor,
a fourth connecting part which connects the radio frequency coil and the conductor part via a fifth capacitor,
a fifth connecting part which connects the radio frequency coil and the conductor part via a sixth capacitor, and
a sixth connecting part which connects the radio frequency coil and the conductor part via a seventh capacitor, and wherein
the third connecting part and the fourth connecting part are disposed on both sides of the first connecting part along the first loop coil, and the fifth connecting part and the sixth connecting part are disposed on both sides of the second connecting part along the first loop coil.

6. The nuclear magnetic resonance imaging system according to claim 5, wherein:
the second connecting part is provided with an electric power supply circuit disposed in parallel to the third capacitor.

7. The nuclear magnetic resonance imaging system according to claim 4, wherein:
the first connecting part and the second connecting part are joined to either a plurality of junctions of the first loop coil and a plurality of the linear conductors, or a plurality of junctions of the second loop coil and a plurality of the linear conductors, respectively.

8. The nuclear magnetic resonance imaging system according to claim 4, wherein:
the second connecting part is provided with an electric power supply circuit disposed in parallel to the third capacitor.

9. The nuclear magnetic resonance imaging system according to claim 1, wherein:
the plurality of connecting parts are joined to either a plurality of junctions of the first loop coil and a plurality of the linear conductors, or a plurality of junctions of the second loop coil and a plurality of the linear conductors, respectively.

10. The nuclear magnetic resonance imaging system according to claim 1, wherein:
the gradient coil comprises a first part which surrounds periphery of the radio frequency coil, and a second part in the vicinity of the end of the gradient coil, and the first part has an internal diameter larger than that of the second part.

11. The nuclear magnetic resonance imaging system according to claim 10, wherein:
the gradient coil has a tapered part between the first part and the second part.

12. The nuclear magnetic resonance imaging system according to claim 1, wherein:
the gradient coil has a shape in which internal diameter becomes smaller from the center to the end thereof along the direction of the static magnetic field generated by the static magnetic field generating source.

13. A nuclear magnetic resonance imaging system comprising:
a static magnetic field generating source of a cylindrical shape which generates a static magnetic field,
a gradient coil which is disposed along the static magnetic field generating source in a test region surrounded by the static magnetic field generating source,
a radio frequency coil which is disposed along the gradient coil in the test region at a position closer to the center of the test region compared with the gradient coil, and comprises a first loop coil and a second loop coil locating in planes substantially perpendicular to direction of the static magnetic field, a plurality of linear conductors connecting the first loop coil and the second loop coil and substantially parallel to the direction of the static magnetic field, and a plurality of first capacitors disposed in the first loop coil and the second loop coil, and
a conductor part which is disposed between the gradient coil and the radio frequency coil, wherein:
the conductor part covers periphery of the radio frequency coil, the gradient coil comprises a first part which surrounds periphery of the radio frequency coil, and a second part closer to the end of the gradient coil, and the first part has an internal diameter larger than that of the second part.

14. A nuclear magnetic resonance imaging system comprising:
a static magnetic field generating source of a cylindrical shape which generates a static magnetic field,
a gradient coil which is disposed along the static magnetic field generating source in a test region surrounded by the static magnetic field generating source,
a radio frequency coil which is disposed along the gradient coil in the test region at a position closer to the center of the test region compared with the gradient coil, and comprises a first loop coil and a second loop coil locating in planes substantially perpendicular to direction of the static magnetic field, a plurality of linear conductors connecting the first loop coil and the second loop coil and substantially parallel to the direction of the static magnetic field, and a plurality of first capacitors disposed in the first loop coil and the second loop coil, and
a conductor part which is disposed between the gradient coil and the radio frequency coil, wherein:
the conductor part covers periphery of the radio frequency coil, and the gradient coil has a shape in which internal diameter becomes smaller from the center to the end thereof along the direction of the static magnetic field generated by the static magnetic field generating source.

15. A coil unit comprising:
a radio frequency coil which comprises a first loop coil and a second loop coil locating in planes substantially perpendicular to direction of static magnetic field to be applied, a plurality of linear conductors connecting the first loop coil and the second loop coil and substantially parallel to the direction of the static magnetic field, and a plurality of first capacitors disposed in the first loop coil and the second loop coil, and
a conductor part which covers periphery of the radio frequency coil, wherein:
the coil unit is provided with a plurality of connecting parts which electrically connect the radio frequency coil and the conductor part via capacitors, and an electric power supply circuit provided in at least one of a plurality of the connecting parts and connected in parallel to the capacitor in the connecting part.

* * * * *